(12) United States Patent
Kunikiyo

(10) Patent No.: US 6,380,578 B1
(45) Date of Patent: Apr. 30, 2002

(54) HIGH-SPEED STACKED CAPACITOR IN SOI STRUCTURE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/477,013

(22) Filed: Jan. 3, 2000

(30) Foreign Application Priority Data

Aug. 30, 1999 (JP) ............................................ 11-242643

(51) Int. Cl.[7] .............................................. H01L 27/108
(52) U.S. Cl. ........................ 257/301; 257/296; 438/386; 438/243; 438/238; 438/239; 438/399
(58) Field of Search ................................ 257/301, 296; 438/386, 243, 238, 239, 399

(56) References Cited

U.S. PATENT DOCUMENTS

| | | | | |
|---|---|---|---|---|
| 5,250,836 | A | * 10/1993 | Miura et al. ................ | 257/506 |
| 5,475,248 | A | * 12/1995 | Takenaka .................... | 257/295 |
| 5,759,907 | A | 6/1998 | Assaderaghi et al. ....... | 438/386 |
| 5,770,484 | A | 6/1998 | Kleinhenz ................... | 438/155 |
| 5,905,279 | A | * 5/1999 | Nitayama et al. ........... | 257/301 |
| 6,060,738 | A1 | * 5/2001 | Hidaka et al. .............. | 257/306 |
| 6,258,684 | B1 | * 7/2001 | Kang .......................... | 438/311 |

FOREIGN PATENT DOCUMENTS

| | | | |
|---|---|---|---|
| JP | 2-288263 | 11/1990 | |
| JP | 08088332 | * 4/1996 | ......... H01L/27/108 |

* cited by examiner

Primary Examiner—Nathan Flynn
Assistant Examiner—Scott R Wilson
(74) Attorney, Agent, or Firm—Oblon, Spivak, McClelland, Maier & Neustadt, P.C.

(57) ABSTRACT

Implemented are a semiconductor device comprising a trench type capacitor having such a structure that a soft error tolerance is excellent, a contact resistance between an electrode and a metal wiring has a small value, a fringe capacitance on an end is reduced and area penalty is not increased, and a method for manufacturing the semiconductor device. The trench type capacitor is formed to have a bottom face in a BOX layer (2) without penetrating the BOX layer (2). Moreover, an end of the capacitor, that is, each of ends of a first electrode (6), a dielectric film (7) and a second electrode (8) is flattened. An insulating film (16) and a side wall (9) are formed to cover the ends of the first electrode (6), the dielectric film (7) and the second electrode (8). Furthermore, a contact plug (10) for connecting the second electrode (8) to a metal wiring (14a) provided as an upper layer is buried in a region surrounded by the side wall (9). Then, a metal silicide (12) and a metal nitride film (13) are formed in a connecting portion of the contact plug (10) and the metal wiring (14a).

7 Claims, 20 Drawing Sheets

HIGH-SPEED STACKED CAPACITOR IN SOI STRUCTURE

BACKGROUND OF THE INVENTION

1. Field of the Invention

The present invention relates to a semiconductor device comprising a capacitor having large capacity and low impedance characteristics, and more particularly to a trench type capacitor formed in an SOI (Silicon On Insulator) substrate and a method for manufacturing the trench type capacitor.

2. Description of the Background Art

In a circuit performing a high-speed operation, noises are made by switching a current at a high speed. Such noises are caused by the existence of a parasitic inductance, a parasitic capacitance and a parasitic resistance in each element of the circuit.

In order to reduce the noises, a capacitor having a large capacity and a low impedance is often provided between a DC voltage source such as Vcc and a ground. However, the parasitic resistance existing in an electrode portion of the capacitor hinders the noises from being reduced. In a chip in which an operation is performed in response to a minute signal and an analog circuit and a digital circuit are provided together, particularly, such noises cause serious problems. Accordingly, it is desirable that the capacitor should have a smaller parasitic resistance.

In the case where a capacitor is to be manufactured on a semiconductor substrate, a MOS capacitor or a pn junction capacitor has conventionally been employed.

The MOS capacitor is an element constituting a capacitor by using a MOS gate formed on a semiconductor substrate and an active region formed in the semiconductor substrate. The MOS capacitor is classified into an inversion type and a storage type. The inversion type MOS capacitor is an element having the same structure as the structure of a MOSFET, and designates an element of such a type that a channel layer and a gate electrode in the MOSFET act as both electrodes of the capacitor. On the other hand, the storage type MOS capacitor is an element having such a structure that a MOS gate is formed on an active region provided in a semiconductor substrate, and designates an element of such a type that a gate electrode and the active region act as both electrodes of the capacitor.

Moreover, the pn junction capacitor is an element utilizing a junction capacitance of a pn junction constituted by p-type and n-type active regions formed in the semiconductor substrate.

In the inversion type MOS capacitor, however, a resistance of an inversion layer acting as an electrode is very high, for example, 5 k$\Omega$/□ or more. Therefore, big noises are made during a high-frequency operation. Moreover, in the case where the storage type MOS capacitor is to be formed on an SOI substrate, an active region cannot be formed thickly because an SOI layer provided on a buried oxide film layer (hereinafter referred to as a BOX (Buried Oxide) layer) has a small thickness. Therefore, a parasitic resistance in the active region acting as an electrode has a great value. Furthermore, in the case where the pn junction capacitor is to be formed on the SOI substrate, a parasitic resistance has a great value because an SOI layer has a small thickness in the same manner as the storage type MOS capacitor.

For this reason, a stack type capacitor shown in FIG. 39 has been devised. FIG. 39 is a sectional view showing a memory cell portion and a peripheral circuit portion of a DRAM. A stack type capacitor 65 is employed for the memory cell portion. The memory cell portion comprises a plurality of memory cells. In each memory cell, a MOS transistor constituted by a MOS gate structure including a gate insulating film 54 and a gate electrode 55 and active regions 52 and 53 formed in a semiconductor substrate 50 and the stack type capacitor 65 connected to the active region 53 through a contact plug 58 make a set. The stack type capacitor 65 is constituted by a first electrode 63 connected to the contact plug 58, a dielectric film 62 and a second electrode 64.

Such a stack type capacitor 65 does not have an electrode thereof formed in the semiconductor substrate 50. Therefore, the electrode can have an optional shape, thereby reducing a resistance value. Accordingly, if the stack type capacitor is formed on the SOI substrate, it is possible to eliminate the problem of a parasitic resistance generated by forming an electrode on an SOI layer.

In order to form the electrode of the stack type capacitor 65 to have an optional shape, however, attention should be paid such that the electrode is not short-circuited with a bit line 59 (which is shown in a broken line because it is present on a section other than a section of FIG. 39). For this reason, the stack type capacitor 65 is often formed in a high position seen from a surface of the semiconductor substrate 50.

If the stack type capacitor 65 is formed in a high position, the following drawbacks are caused. For example, in the case where the second electrode 64 of the stack type capacitor 65 and a wiring 66 in the peripheral circuit portion are to be formed at the same time, a conductive material is formed on the dielectric film 62 and an interlayer insulating film 57 and is then subjected to patterning. However, in the case where the second electrode 64 and the wiring 66 are to be patterned by using a photolithography technique, there is a possibility that a difference Y in height between the memory cell portion and the peripheral circuit portion might exceed a depth of focus of a lens (an index indicating an allowable range of focus). If the difference Y in height exceeds the depth of focus, there is a possibility that either or both of the second electrode 64 and the wiring 66 might be subjected to the patterning in a blurred state, thereby obtaining no design dimension.

Moreover, in the case where the wiring 66 is to be formed simultaneously with the formation of the bit line 59 and the second electrode 64 is to be formed simultaneously with the formation of a wiring 67 in order to avoid the problems of the depth of focus, an aspect ratio of a contact plug 67a of the wiring 67 is increased. Consequently, it is hard to form a via hole for the contact plug 67a and to bury a conductive material in the via hole.

There has been devised a trench type capacitor having such a structure that a capacitor is not formed on a semiconductor substrate but is fabricated in the semiconductor substrate differently from the stack type capacitor.

FIG. 40 is a sectional view showing the prior art described in U.S. Pat. No. 5,759,907 as an example of the trench type capacitor. FIG. 40 illustrates a trench type capacitor constituted by a dielectric film 119 buried in a trench 118, an SOI layer 117 and an impurity implantation region 116 which act as a first electrode, and a polysilicon 120 acting as a second electrode. According to this technique, the trench 118 is formed deeply to reach a semiconductor substrate 110 through a BOX layer 111 and the SOI layer 117. Therefore, a contact area of each electrode and the dielectric film can be increased and a large capacity can be implemented.

Moreover, the impurity implantation region 116 acting as the first electrode and the polysilicon 120 acting as the second electrode can be formed thickly or largely. Thus, the problem of a parasitic resistance can be restrained.

In the case where a rays enter the semiconductor substrate 110 to generate a large number of electron—hole pairs in the trench type capacitor shown in FIG. 40, their electric charges move to a DC voltage source or a ground through the impurity implantation region 116, the polysilicon 120 in a trench 118a and a metal wiring 125. Consequently, there is a problem in that a fluctuation in a source voltage is caused. In other words, a tolerance to soft errors is small. For example, when neutron rays are irradiated on a very small amount of boron $^{10}B$ present in BPSG to be used as an interlayer insulating film, the boron $^{10}B$ generates a rays having a low energy of 1 MeV or less so that the soft errors are made. The maximum quantity of electric charges are generated within a range of the α rays. Since the range of the α rays having an energy of 1 Mev is about 5 μm, for example, the largest number of electric charges are generated in the semiconductor substrate in a position where a depth from the interlayer insulating film is almost equal to the range.

In the trench type capacitor shown in FIG. 40, moreover, the polysilicon 120 acting as the electrode and the metal wiring 125 are directly provided in contact with each other. Therefore, there is a problem in that a contact resistance is raised, resulting in an increase in a parasitic resistance value of the capacitor.

In order to enhance a soft error tolerance, it can also be supposed that a trench type capacitor is formed on a trench which does not penetrate the BOX layer in the SOI substrate. Consequently, even if radioactive rays enter to generate electric charges in the semiconductor substrate, the BOX layer becomes an insulating film for preventing the movement of the electric charges.

As the trench type capacitor having the above-mentioned structure, for example, Japanese Patent Application Laid-Open Gazette No. P02-288263 has described the art. FIG. 41 is a sectional view showing the art. FIG. 41 illustrates a trench type capacitor constituted by a first electrode 228, a dielectric film 229 and a second electrode 230 which are buried in a trench 227 in a semiconductor substrate 220. The trench type capacitor is formed without penetrating a BOX layer 221. Therefore, the generation of soft errors can be prevented.

In the structure of the trench type capacitor shown in FIG. 41, however, an A portion of the first electrode 228 is protruded in a transverse direction from a width of the trench 227. Consequently, a distance B between the first electrode 228 and a gate electrode 225 of a MOSFET is reduced. There is a possibility that a leakage current might be generated therebetween. Moreover, since the portion A is protruded, area penalty (a degree of an impediment to the effective utilization of a substrate surface area) is increased. In a DRAM, particularly, a large number of capacitors are formed. Therefore, a slight increase in the area penalty also affects an integration degree.

Furthermore, there is the protruded portion A. Therefore, an area of the first electrode 228 on an end of the capacitor is increased. Consequently, a fringe capacitance $C_{12}$ between the first electrode 228 and the second electrode 230 on the end of the capacitor is increased so that big noises are made.

In the art, a contact resistance between an electrode and a metal wiring is not taken into consideration.

SUMMARY OF THE INVENTION

In order to solve the above-mentioned problems, it is an object of the present invention to implement a semiconductor device comprising a trench type capacitor having such a structure that a soft error tolerance is excellent, a contact resistance between an electrode and a metal wiring has a small value, a fringe capacitance on an end is reduced and area penalty is not increased, and a method for manufacturing the semiconductor device.

A first aspect of the present invention is directed to a semiconductor device comprising a semiconductor substrate, a first layer of insulation formed on the semiconductor substrate, a second layer including at least a semiconductor layer formed on the first layer, a trench provided with an opening having a predetermined width on a surface of the second layer and reaching the first layer without penetrating the first layer, and a capacitor including a first electrode, a dielectric film and a second electrode which are formed in the trench, wherein an end of the capacitor is positioned in the opening of the trench.

A second aspect of the present invention is directed to the semiconductor device according to the first aspect of the present invention, further comprising a contact plug connected to the second electrode and set within a range of the predetermined width.

A third aspect of the present invention is directed to the semiconductor device according to the second aspect of the present invention, further comprising a wiring to be connected to the contact plug, a metal silicide being formed in a portion of the contact plug which is connected to the wiring.

A fourth aspect of the present invention is directed to the semiconductor device according to the third aspect of the present invention, wherein a metal nitride film is formed between the metal silicide and the wiring.

A fifth aspect of the present invention is directed to the semiconductor device according to any of the second to fourth aspects of the present invention, further comprising an insulator for covering the end of the capacitor.

A sixth aspect of the present invention is directed to the semiconductor device according to the fifth aspect of the present invention, wherein the insulator includes a first insulating layer which is provided in contact with the end of the capacitor and has a relatively low degree of mismatching of crystal lattice between the first insulating layer and the first electrode and between the first insulating layer and the second electrode, and a second insulating layer which is formed on the first insulating layer and has a relatively high degree of the mismatching of the crystal lattice between the second insulating layer and the first electrode and between the second insulating layer and the second electrode.

A seventh aspect of the present invention is directed to the semiconductor device according to any of the first to sixth aspects of the present invention, further comprising an active region connected to the first electrode in the second layer, the active region constituting a part of a transistor or being connected to the transistor.

An eighth aspect of the present invention is directed to a method for manufacturing a semiconductor device comprising a first step of preparing a semiconductor substrate having a first layer of insulation formed on a surface of the semiconductor substrate and a second layer including at least a semiconductor layer formed on the first layer, a second step of forming a first trench provided with an opening having a predetermined width on a surface of the second layer and reaching the first layer without penetrating the first layer, a third step of forming a first conductive film over a whole surface of the semiconductor substrate, a fourth step of forming a dielectric film on the first conductive film, a fifth step of forming a second conductive film on the dielectric film, and a sixth step of removing portions of the first conductive film, the dielectric film and the second conductive film which are provided on the surface of the second layer.

A ninth aspect of the present invention is directed to the method for manufacturing a semiconductor device according to the eighth aspect of the present invention, further comprising a seventh step of forming a third layer of insulation on the second layer, the first conductive film, the dielectric film and the second conductive film, an eighth step of forming, on the third layer, a second trench provided with an opening set within a range of the predetermined width on a surface of the third layer and connected to the second conductive film, a ninth step of forming a third conductive film over the whole surface of the semiconductor substrate, and a tenth step of removing a portion of the third conductive film provided on the surface of the third layer.

A tenth aspect of the present invention is directed to the method for manufacturing a semiconductor device according to the ninth aspect of the present invention, further comprising an eleventh step of forming a metal film to cover the third conductive film, a twelfth step of heat treating the third conductive film and the metal film, a thirteenth step of removing the metal film which has not reacted to the third conductive film, and a fourteenth step of forming a fourth conductive film on the third conductive film which has reacted to the metal film and patterning the fourth conductive film by using a photolithography technique.

An eleventh aspect of the present invention is directed to the method for manufacturing a semiconductor device according to the tenth aspect of the present invention, wherein the fourteenth step also includes a step of forming a metal nitride film between the third conductive film which has reacted to the metal film and the fourth conductive film.

A twelfth aspect of the present invention is directed to the method for manufacturing a semiconductor device according to any of the ninth to eleventh aspects of the present invention, wherein the eighth step includes a step of forming, on the third layer, a third trench having the same width as the predetermined width and positioned above the first trench, and then forming a fourth layer of insulation covering the third layer and carrying out anisotropic etching on the fourth layer, thereby forming the second trench.

A thirteenth aspect of the present invention is directed to the method for manufacturing a semiconductor device according to the twelfth aspect of the present invention, further comprising a fifteenth step of forming a fifth layer of insulation by heat treating respective surfaces of the first conductive film, the dielectric film and the second conductive film which are exposed to the opening after the sixth step and before the seventh step.

A fourteenth aspect of the present invention is directed to the method for manufacturing a semiconductor device according to the thirteenth aspect of the present invention, further comprising a sixteenth step of forming a sixth layer on the second layer and the fifth layer after the fifteenth step and before the seventh step.

A fifteenth aspect of the present invention is directed to the method for manufacturing a semiconductor device according to any of the eighth to fourteenth aspects of the present invention, wherein the first step includes a step of forming, in the second layer, an active region and a transistor connected to or including as a part the active region.

According to the first aspect of the present invention, it is possible to obtain a trench type capacitor having such a structure that a soft error tolerance is excellent, a fringe capacitance is reduced on an end and area penalty is not increased. Moreover, heat accumulated in the semiconductor substrate and the first layer can be discharged to the outside by the capacitor.

According to the second aspect of the present invention, the contact plug does not increase the area penalty.

According to the third aspect of the present invention, in the case where the wiring is formed of a metal and the contact plug is formed of a polysilicon, a value of a contact resistance between the wiring and the contact plug can be decreased. Moreover, lines of electric force sent from other wirings can be prevented from entering the second electrode.

According to the fourth aspect of the present invention, in the case where the wiring is formed of a metal and the contact plug is formed of a polysilicon, it is possible to prevent the metal constituting the wiring and a metal and silicon in the metal silicide from mutually moving and reacting to generate foreign matters.

According to the fifth aspect of the present invention, it is guaranteed that the contact plug is not connected to the first electrode but is connected to the second electrode.

According to the sixth aspect of the present invention, also in the case where a material having a high degree of the mismatching of the crystal lattice between the first and second electrodes is used for the second insulating layer, it is possible to prevent an interface state from being generated between the insulator and the end of the capacitor.

According to the seventh aspect of the present invention, the capacitor and the transistor can be used as a memory cell of a DRAM, for example.

According to the eighth aspect of the present invention, the semiconductor device in accordance with the first aspect of the present invention can be manufactured. Moreover, the second layer can be caused to function as a stopper at the sixth step by using, for the second layer, a material having selectivity for each of the first conductive film, the dielectric film and the second conductive film.

According to the ninth aspect of the present invention, the semiconductor device in accordance with the second aspect of the present invention can be manufactured. Moreover, the second conductive film can be caused to function as a stopper at the eighth step by using, for the second conductive film, a material having selectivity for the third layer. Furthermore, the third layer can be caused to function as a stopper at the tenth step by using, for the third layer, a material having selectivity for the third conductive film.

According to the tenth aspect of the present invention, the semiconductor device in accordance with the third aspect of the present invention can be manufactured.

According to the eleventh aspect of the present invention, the semiconductor device in accordance with the fourth aspect of the present invention can be manufactured.

According to the twelfth aspect of the present invention, the semiconductor device in accordance with the fifth aspect of the present invention can be manufactured. By adjusting a thickness of the fourth layer and etching conditions, moreover, the second trench is not connected to the first conductive film but can be connected to the second conductive film. Furthermore, the second conductive film can be caused to function as a stopper at the eighth step by using, for the second conductive film, a material having selectivity for the fourth layer.

According to the thirteenth aspect of the present invention, the semiconductor device in accordance with the sixth aspect of the present invention can be manufactured. Moreover, even if foreign matters remain in the opening of the first trench, they can be insulated by a heat treatment. Thus, it is guaranteed that the first and second conductive films can be prevented from being short-circuited.

According to the fourteenth aspect of the present invention, the sixth layer can be caused to function as a stopper during the formation of the third trench by using, for the sixth layer, a material having selectivity for the third layer.

According to the fifteenth aspect of the present invention, the semiconductor device in accordance with the seventh aspect of the present invention can be manufactured.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
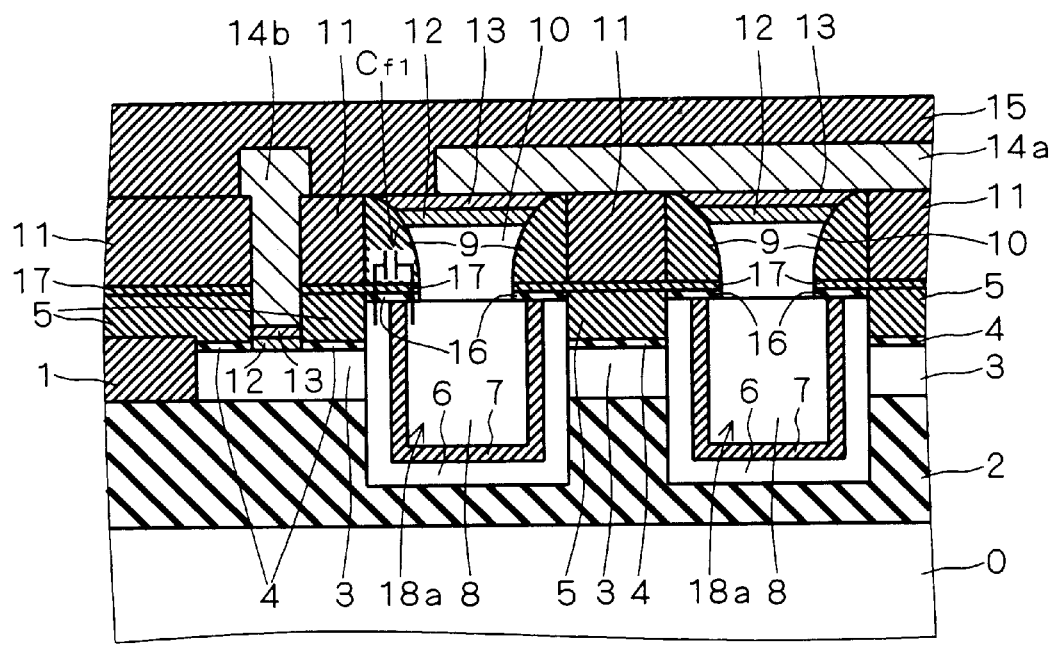
FIG. 1 is a sectional view showing a semiconductor device according to a first embodiment.

FIG. 1 shows a semiconductor device according to the present embodiment. The semiconductor device comprises a semiconductor substrate 0 having a BOX layer 2 formed on a surface, an SOI layer 3 formed on the BOX layer 2 in which an impurity such as phosphorus or arsenic is implanted, and a trench type capacitor formed in a trench 18a having an opening on a surface of an insulating film 5 through an insulating film 4 and the insulating film 5 which are formed on the SOI layer 3 and having a bottom face in the BOX layer 2 without penetrating the BOX layer 2. Assuming that the BOX layer 2 acts as a first layer and the SOI layer 3, the insulating film 4 and the insulating film 5 constitute a second layer together, the trench 18a has such a structure that it is provided with an opening having a predetermined width on a surface of the second layer and reaches the first layer but does not penetrate the first layer. A first electrode 6, a dielectric film 7 and a second electrode 8 are sequentially formed in the trench 18a apart from an internal wall of the trench 18a, and constitute the trench type capacitor. An end of the capacitor, that is, an end of each of the first electrode 6, the dielectric film 7 and the second electrode 8 is positioned in the opening of the trench 18a and is flattened.

For example, it is preferable that a polysilicon having an impurity implanted therein should be employed for the first electrode 6 and the second electrode 8 and a high dielectric film such as tantalum oxide, a silicon oxide film or the like should be used for the dielectric film 7. Moreover, a silicon oxide film is employed for the insulating film 4 and a silicon nitride film is employed for the insulating film 5, for example. Furthermore, an STI (Shallow Trench Isolation) region 1 for element isolation is provided on the SOI layer 3. For example, an SiOF film (silicon oxide fluoride film) is employed for the STI region 1.

An insulating film 16 is formed to cover the ends of the first electrode 6, the dielectric film 7 and the second electrode 8, and furthermore, a side wall 9 is formed on the insulating film 16 with an insulating film 17 interposed therebetween. The insulating film 17 is formed on an upper face of the insulating film 5 as well as on an upper face of the insulating film 16, and an interlayer insulating film 11 is formed on an upper face of the insulating film 17. The interlayer insulating film 11 is not present above the trench 18a. For example, a silicon nitride film is employed for the side wall 9, a silicon oxide film is employed for the insulating film 16, a silicon nitride film is employed for the insulating film 17, and an SiOF film or a BPSG film is employed for the interlayer insulating film 11.

A contact plug 10 for connecting the second electrode 8 to a metal wiring 14a provided as an upper layer is buried in a region provided above the trench 18a where the insulating films 16 and 17 are not present.

Moreover, a metal silicide 12 and a metal nitride film 13 are formed in a connecting portion of the contact plug 10 and the metal wiring 14a. It is preferable that a polysilicon having an impurity implanted therein should be employed for a material of the contact plug 10 in the same manner as the first electrode 6 and the second electrode 8, for example. Furthermore, it is preferable that a high-melting-point metal silicide such as cobalt silicide, nickel silicide, tungsten silicide, titanium silicide, molybdenum silicide, platinum silicide, zirconium silicide or the like should be used for the metal silicide 12. By forming the metal silicide 12, a contact resistance can greatly be reduced. Besides, it is preferable that titanium nitride, nickel nitride, tungsten nitride, molybdenum nitride, platinum nitride, zirconium nitride or the like should be employed for the metal nitride film 13. The metal nitride film has the function of preventing a metal constituting the metal wiring 14a and a metal and silicon in the metal silicide 12 from mutually moving and reacting to generate foreign matters.

Furthermore, a metal wiring 14b is formed through the interlayer insulating film 11 and the insulating films 17, 5 and 4, and is connected to the SOI layer 3. The metal silicide 12 and the metal nitride film 13 are also formed in the connecting portion of the metal wiring 14b and the SOI layer 3.

Then, an interlayer insulating film 15 is formed to cover the metal wirings 14a and 14b and the interlayer insulating film 11. For example, an SiOF film or a BPSG film is also employed for the interlayer insulating film 15 in the same manner as in the interlayer insulating film 11.

The semiconductor device according to the present embodiment has such a structure that the first electrode 6 and the second electrode 8 are provided within a range of the opening of the trench 18a as seen from an upper face of the trench type capacitor and the trench type capacitor does not increase area penalty. Moreover, the contact plug 10 is also provided within the range of the opening of the trench 18a. Therefore, the area penalty is not increased.

Besides, the trench does not penetrate the BOX layer. Consequently, it is possible to obtain a trench type capacitor having an excellent soft error tolerance.

Furthermore, the first electrode 6 and the second electrode 8 are exposed to the opening of the trench 18a and a portion protruded from the trench 18a is not present. Therefore, a fringe capacitance $C_{f1}$ between the first electrode 6 and the second electrode 8 on an end of the capacitor has a small value.

Moreover, the trench type capacitor is provided as a dummy on the substrate, and can also be used as a heat sink for reducing a temperature of the SOI substrate during an operation of a circuit. The BOX layer 2 usually has a smaller thermal conductivity than in the SOI layer 3. Therefore, heat generated during the operation of the circuit is easily accumulated in the BOX layer 2, and an operating speed of the circuit provided on the SOI substrate is readily reduced. However, if the trench type capacitor is used as the heat sink and the metal wiring 14a is connected to an external heat sink, for example, the heat accumulated in the semiconductor substrate 0 and the BOX layer 2 can be discharged to the outside.

Besides, the trench type capacitor may be annularly formed and used for a dummy pattern of a CMP treatment, for example.

Furthermore, since the metal silicide 12 is formed, the value of the contact resistance between the metal wiring 14a and the contact plug 10 can be decreased.

A method for manufacturing the trench type capacitor shown in FIG. 1 will be described below with reference to FIGS. 2 to 15. First of all, a semiconductor substrate 0 having a BOX layer 2 and a SOI layer 3 formed thereon is prepared. Then, the SOI layer 3 is subjected to patterning by using photolithography and etching techniques, and an SiOF film or the like is then buried therein. Consequently, an STI region 1 is formed.

For example, thereafter, a surface of the SOI layer 3 is oxidized by a thermal oxidation method, thereby forming a silicon oxide film as an insulating film 4. Subsequently, an impurity such as phosphorus, arsenic or the like is implanted into the SOI layer 3, thereby increasing a conductivity of the SOI layer 3.

Figure 2:
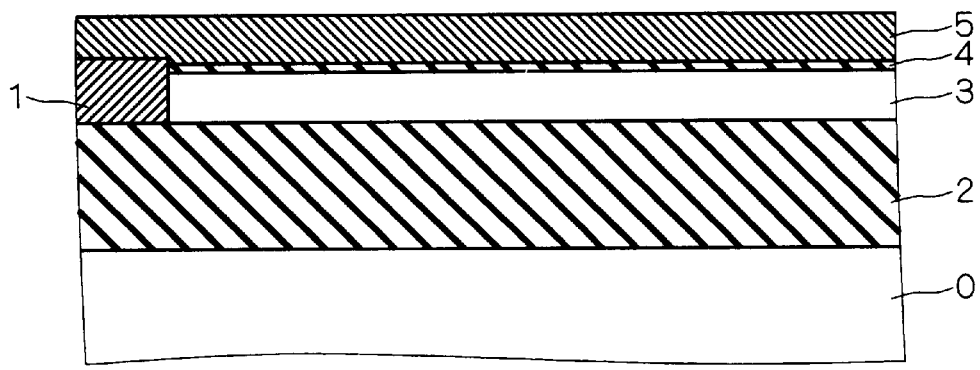
FIGS. 2 to 15 are sectional views showing each step of a method for manufacturing the semiconductor device according to the first embodiment.

Then, an insulating film 5 made of a silicon nitride film is formed on the insulating film 4 by using a CVD (Chemical Vapor Deposition) method, for example (FIG. 2). In the case where the insulating film 5 is made of a silicon nitride film, an interface state is generated due to mismatching of crystal lattice if the insulating film 5 is directly formed on the SOI layer 3. Consequently, thermal noises or 1/f noises are made. However, even if the silicon oxide film is formed on the SOI layer 3, a degree of the mismatching of the crystal lattice is low. Therefore, it is preferable that the silicon oxide film should be employed for the insulating film 4 to act as a buffer layer between the insulating film 5 and the SOI layer 3.

Figure 3:
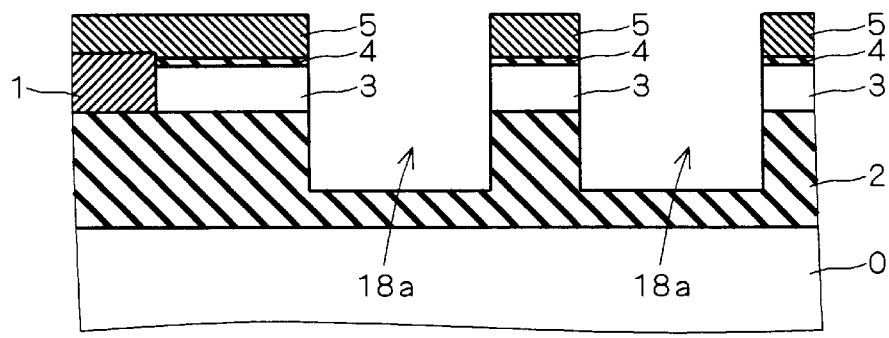
Figure 4:
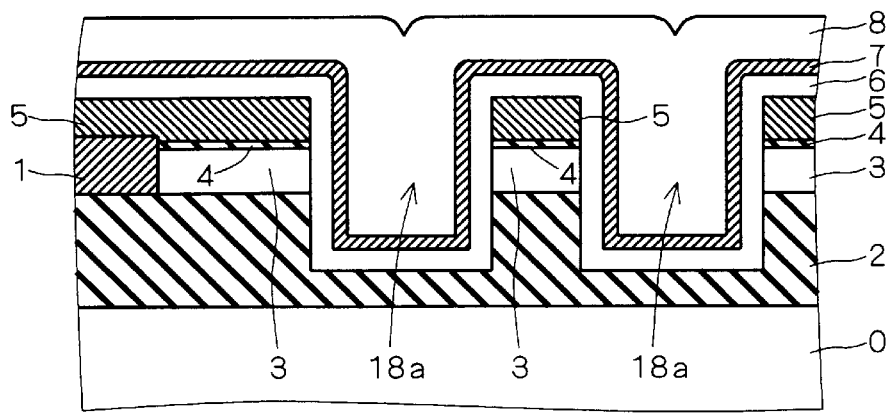
Figure 5:
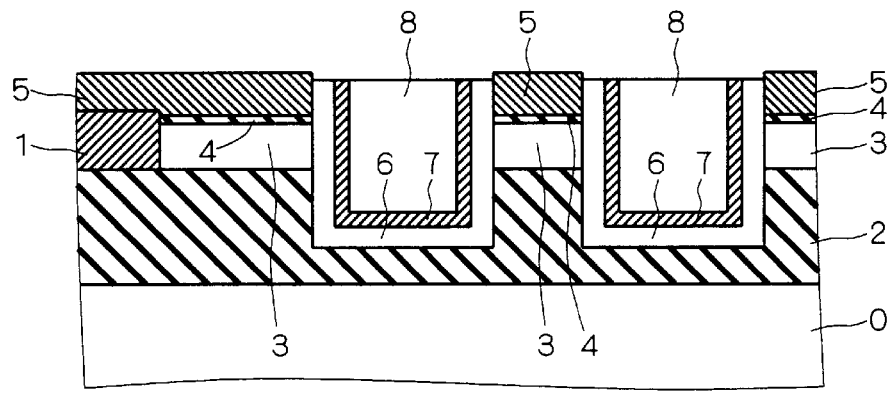

Next, a trench 18a having a bottom face in the BOX layer 2 is formed through the insulating film 5, the insulating film 4 and the SOI layer 3 by using photolithography and etching techniques (FIG. 3). Materials of a first electrode 6, a dielectric film 7 and a second electrode 8 are formed over a whole surface of the substrate in this order, respectively (FIG. 4). Subsequently, a CMP (Chemical Mechanical Polishing) treatment is carried out by using the insulating film 5 as a stopper, thereby removing portions of the materials of the first electrode 6, the dielectric film 7 and the second electrode 8 which are present on a surface of the insulating film 5 (FIG. 5).

Figure 6:
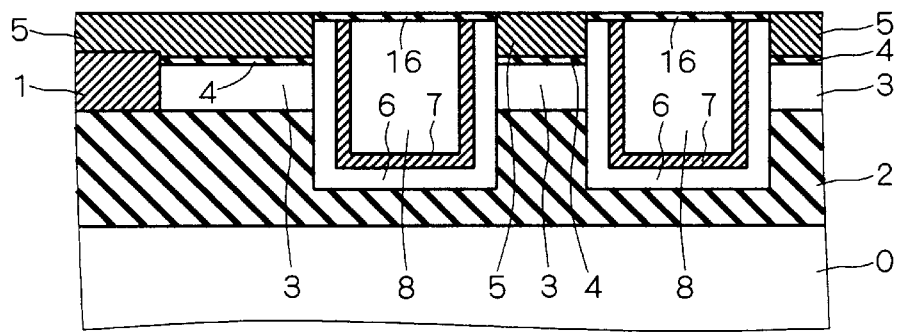
Figure 7:
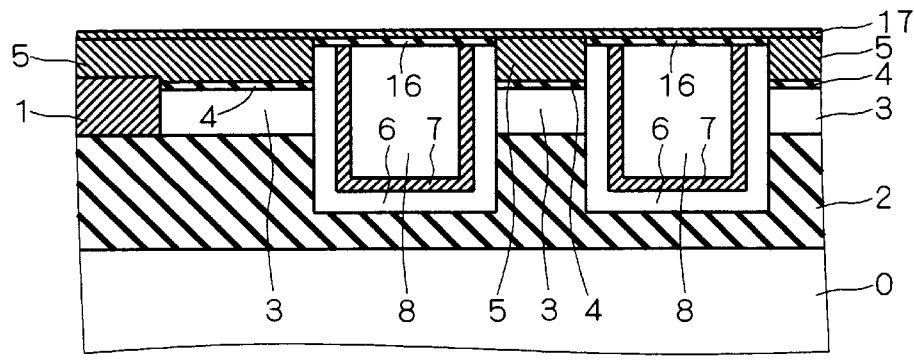

By the thermal oxidation method, an insulating film 16 made of a silicon oxide film is formed on surfaces of the first electrode 6, the dielectric film 7 and the second electrode 8 which are exposed to an opening of the trench 18a (FIG. 6).

Figure 8:
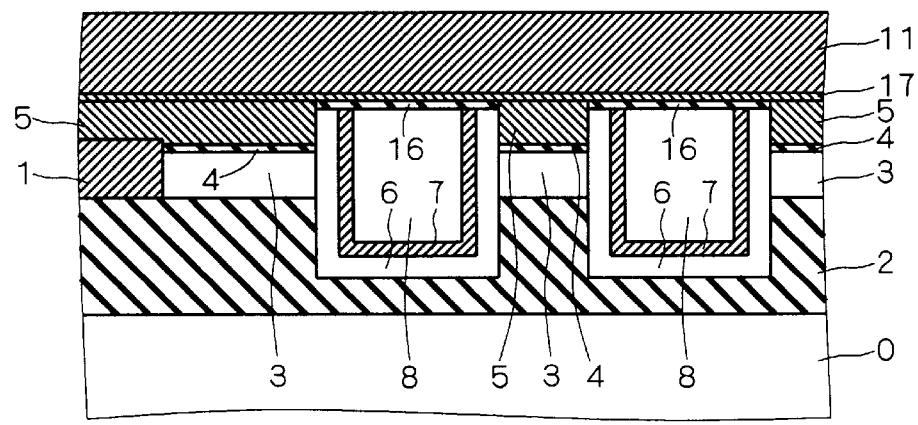
Figure 9:
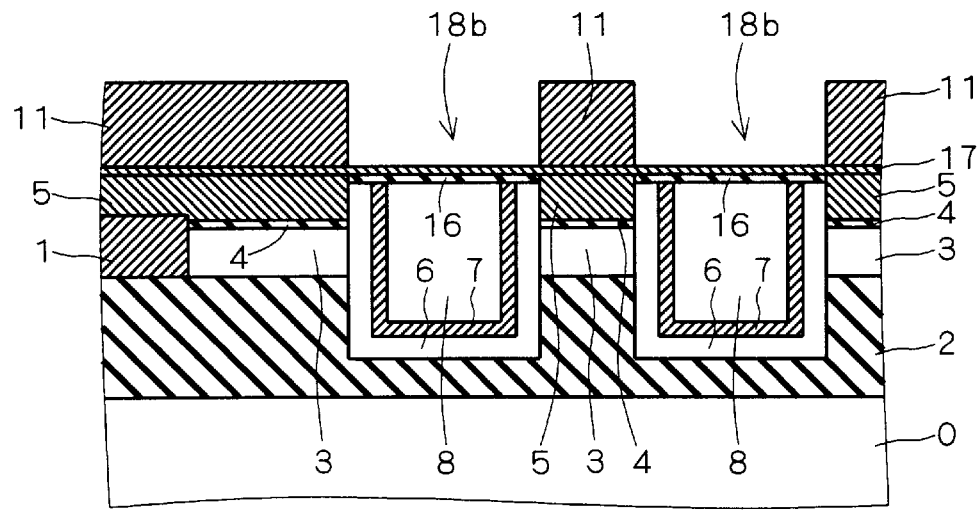
Figure 10:
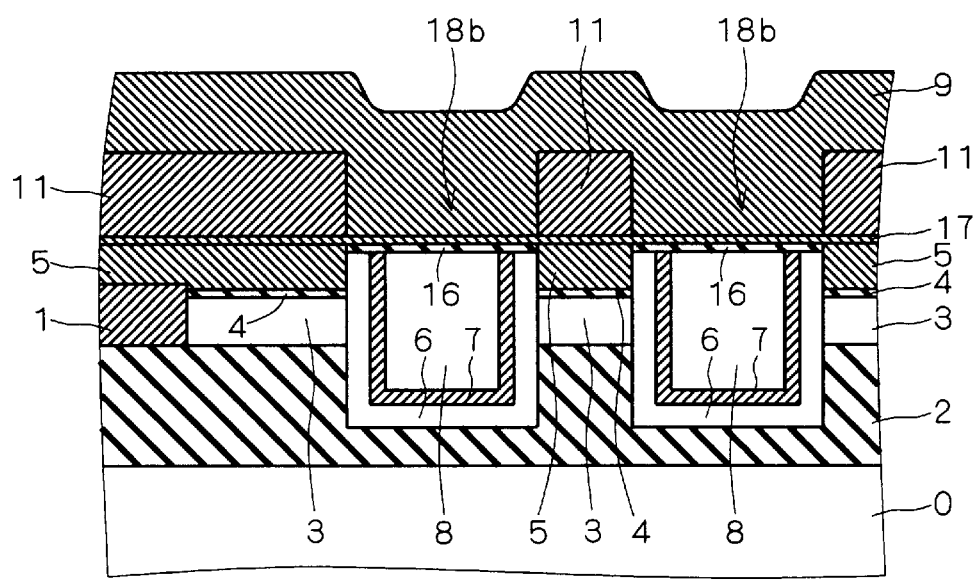

Subsequently, an insulating film 17 is formed over the whole surface of the substrate (FIG. 7), and furthermore, an interlayer insulating film 11 is formed on an upper face of the insulating film 17 (FIG. 8). A trench 18b is formed on the interlayer insulating film 11 provided over the trench 18a by using the photolithography and etching techniques (FIG. 9). For example, if the interlayer insulating film 11 is an SiOF film, it is hard to obtain etching selectivity between the insulating film 16 made of the silicon oxide film and the interlayer insulating film 11. Therefore, there is a high possibility that the insulating film 16 might be removed during the formation of the trench 18b. In order to prevent the removal of the insulating film 16, the insulating film 17 is formed. In the case where the interlayer insulating film 11 is made of the SiOF film as described above, the insulating film 17 functions as an etching stopper of the interlayer insulating film 11 if a silicon nitride film is employed for the insulating film 17, for example.

Moreover, the precision of alignment of the trench 18a and the trench 18b can be enhanced by opening the insulating film 5 or the insulating film 17 to form a trench which is deeper than the surface of the SOI layer 3 separately from the trench 18a and using the trench as an alignment mark, for example.

Figure 11:
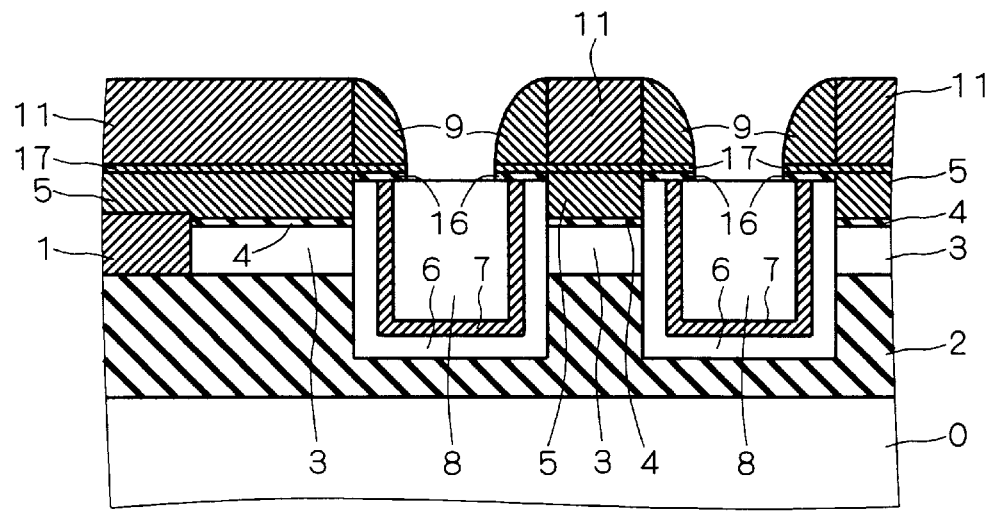

Then, a material of a side wall 9 is formed over the whole surface of the substrate (FIG. 10) and is subjected to anisotropic etching to form the side wall 9 and to etch the insulating films 16 and 17. Consequently, a contact of the second electrode 8 can be obtained (FIG. 11). At this time, the side wall 9 is formed thickly across the first electrode 6, the dielectric film 7 and the second electrode 8.

Figure 12:
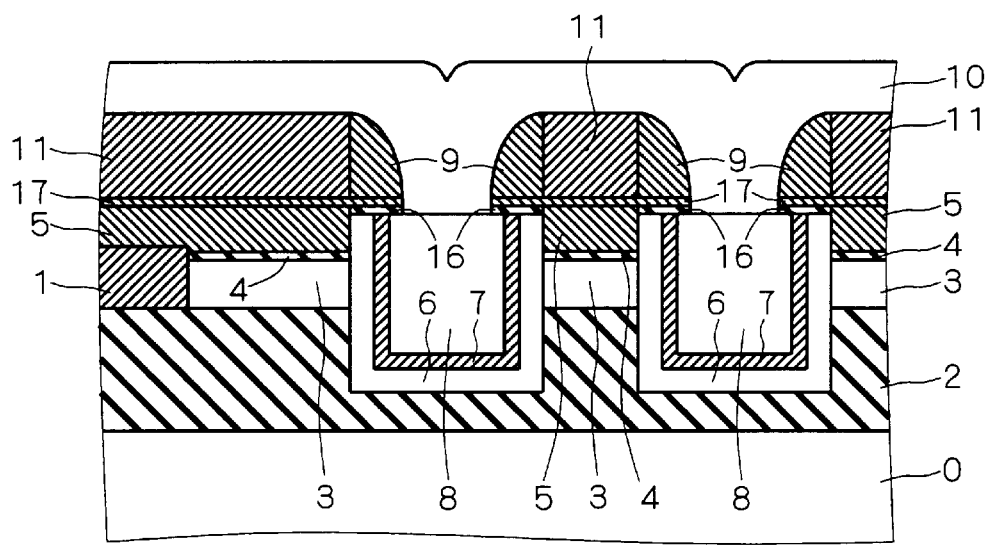
Figure 13:
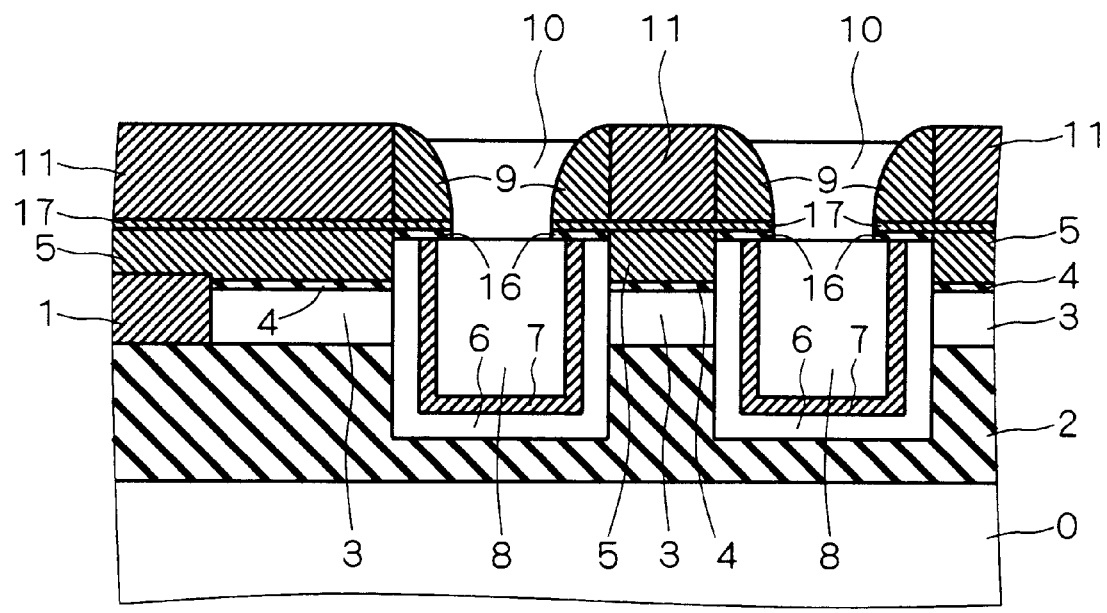

A material of a contact plug 10 is formed over the whole surface of the substrate (FIG. 12). For example, a portion of the material of the contact plug 10 which is provided on a surface of the interlayer insulating film 11 is removed by using a CMP method (FIG. 13). At this time, the interlayer insulating film 11 and the side wall 9 are used as stoppers of the CMP treatment. The material of the contact plug 10 which is provided on the surface of the interlayer insulating film 11 may be removed by the anisotropic etching.

In FIG. 13, assuming that dishing is caused on a surface of the contact plug 10 due to the CMP method, a height of the surface of the contact plug 10 is set in a position which is lower than the surface of the interlayer insulating film 11.

Figure 14:
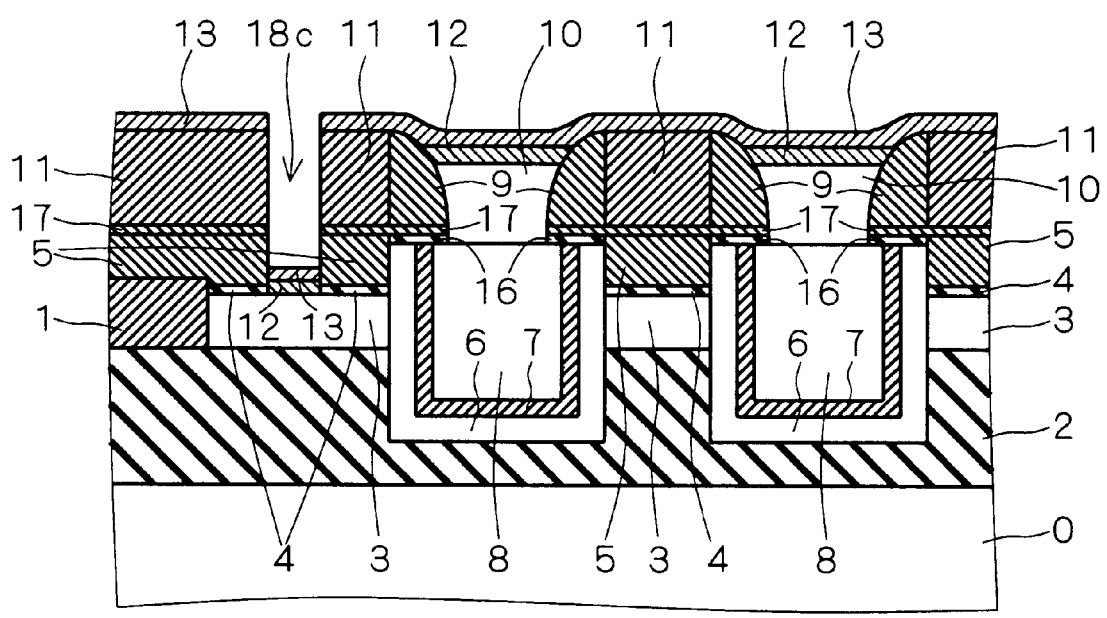

Then, a via hole 18c is formed on the interlayer insulating film 11 and the insulating films 17, 5 and 4. Next, a high-melting-point metal such as cobalt is deposited over the whole surface of the substrate and is subjected to an RTA (Rapid Thermal Annealing) treatment. Consequently, the high-melting-point metal is caused to react to the contact plug 10 and the high-melting-point metal is caused to react to the SOI layer 3 on a bottom of the via hole 18c. Thus, a metal silicide 12 is formed. The high-melting-point metal such as cobalt reacts to only the contact plug 10 and the silicon of the SOI layer 3, and does not react to the interlayer insulating film 11 and the side wall 9. Therefore, the metal silicide 12 can be formed in a manner of self-alignment. By using the interlayer insulating film 11 as a stopper for etching, the unreacted high-melting-point metal remaining on the interlayer insulating film 11 is removed by etching. Subsequently, a metal nitride film 13 such as titanium nitride is deposited (FIG. 14).

Figure 15:
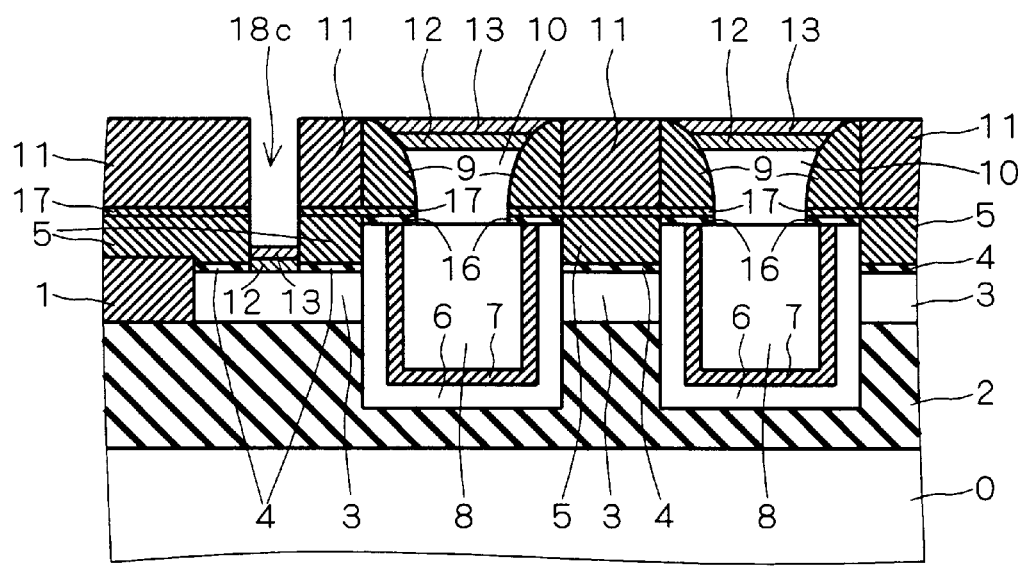

Then, the CMP treatment is carried out by using the interlayer insulating film 11 as a stopper, thereby removing the metal nitride film 13 in portions other than the via hole 18c and the trench 18b (FIG. 15).

Thereafter, a metal film made of tungsten, copper, aluminum, molybdenum or the like is formed over the whole surface of the substrate, and the metal wirings 14a and 14b are subjected to patterning by using the photolithography and etching techniques. Then, an interlayer insulating film 15 is formed. Thus, the trench type capacitor shown in FIG. 1 can be formed.

Figure 16:
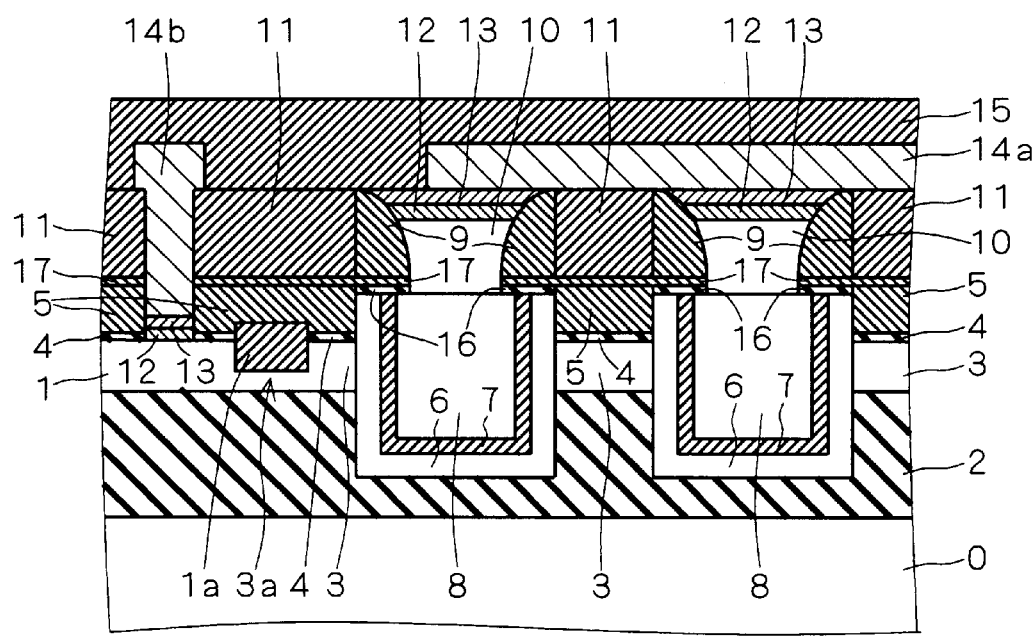
FIGS. 16 and 17 are sectional views showing a variant of the semiconductor device according to the first embodiment.

While a complete separating structure in which the SOI layer 3 is completely separated as the STI region 1 has been employed in FIG. 1, an STI region 1a having a partial trench structure in which the SOI layer 3 is not completely separated may be used as shown in FIG. 16. With the partial trench structure, thus, a channel portion 3a provided under the STI region 1a causes an electric potential of the SOI layer 3 to have a common value in each separated region. Therefore, it is not necessary to connect the SOI layer 3 to a DC voltage source such as Vcc, a ground or the like in each separated region. Accordingly, it is sufficient that a small number of wirings and via holes for giving a fixed potential are formed. Correspondingly, area penalty can be reduced.

Figure 17:
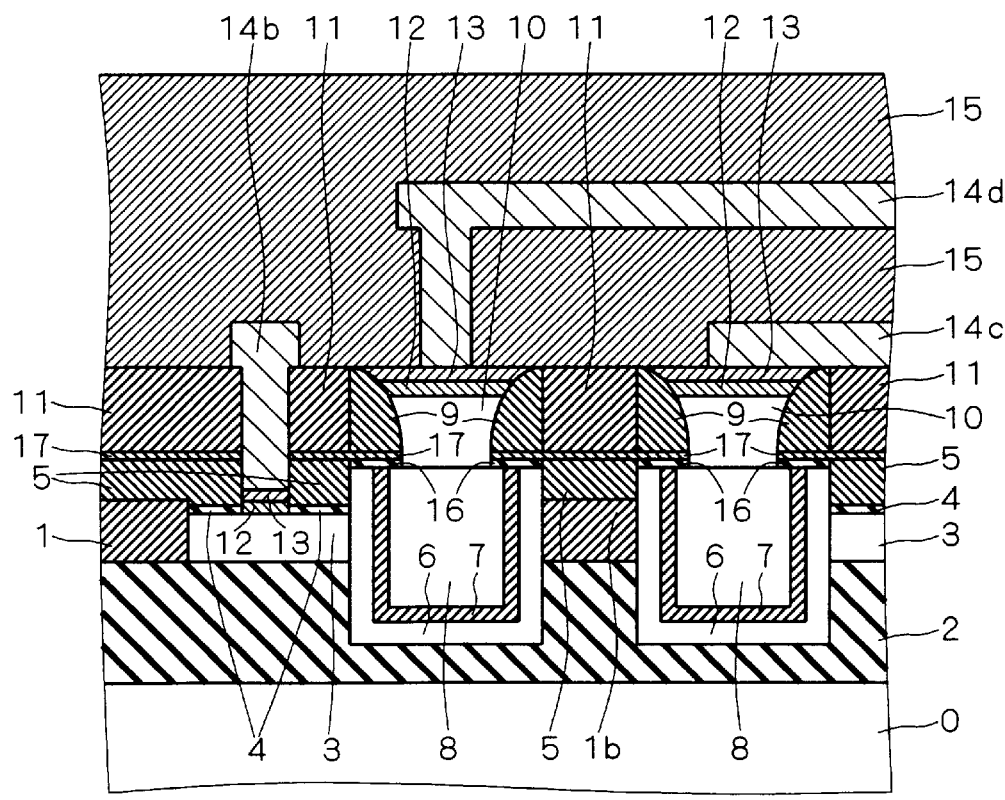

While the first electrodes 6 of the adjacent capacitors are connected to each other through the SOI layer 3 and the second electrodes 8 are connected to each other through the wiring 14a in FIG. 1, the adjacent capacitors may be isolated by using an ST1 region 1b as shown in FIG. 17. In that case, the first electrode 6 of each capacitor is insulated by the STI region 1b and separate wirings 14c and 14d are connected to the second electrodes 8. Although the above-mentioned SiOF film may be employed for the STI region 1b, the STI region 1b may be changed into a cavity which is to be filled with air, thereby reducing a dielectric constant, for example.

While a method for forming the metal silicide 12 and the metal nitride film 13 has been described above on the assumption that the dishing is caused during the CMP treatment of the contact plug 10, it is preferable that the metal silicide 12 and the metal nitride film 13 should be formed by the following method if the dishing is not caused.

Figure 18:
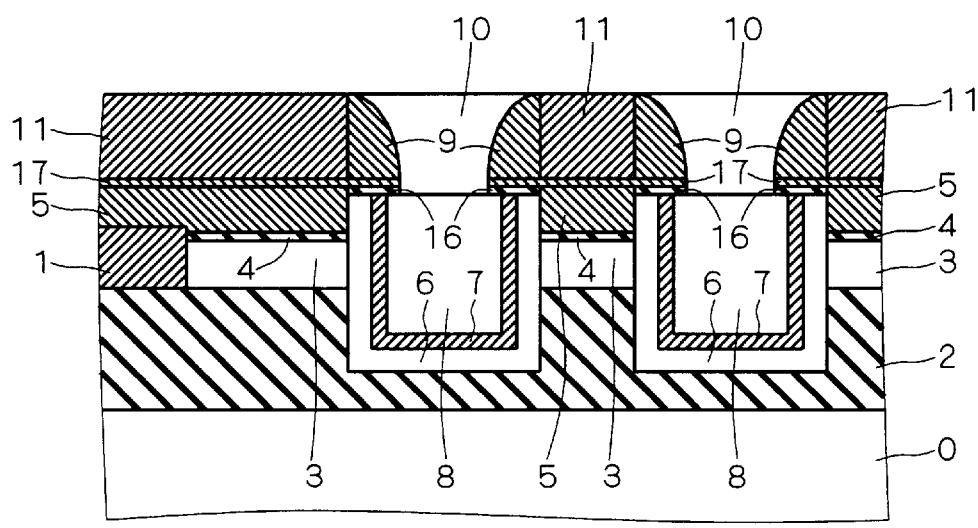
FIGS. 18 to 20 are sectional views showing each step of the method for manufacturing the semiconductor device according to the first embodiment.

First of all, a state shown in FIG. 18 is obtained subsequently to the state shown in FIG. 12 because the dishing is not caused. Then, a high-melting-point metal such as cobalt is deposited over the whole surface of the substrate and is subjected to an RTA treatment. Consequently, the high-melting-point metal and the contact plug 10 are caused to react to each other, and the high-melting-point metal and the SOI layer 3 are caused to react to each other on a bottom of the via hole 18c. Thus, the metal silicide 12 is formed in a manner of self-alignment. The unreacted high-melting-point metal remaining on the interlayer insulating film 11 is removed by etching with the interlayer insulating film 11 acting as a stopper.

Figure 19:
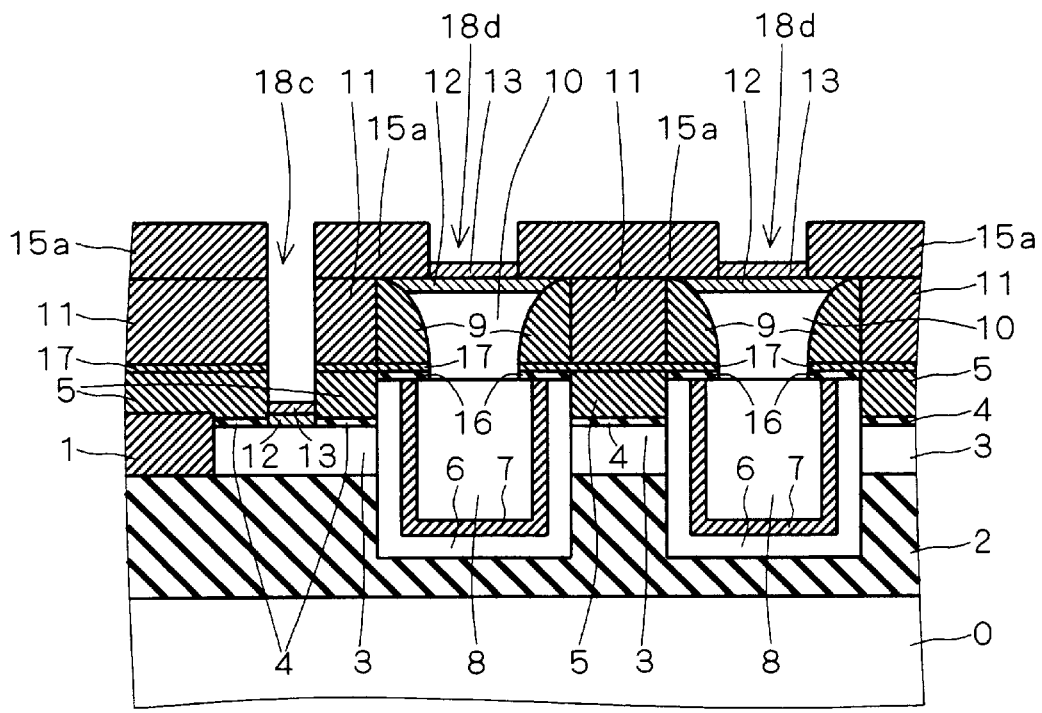

Next, an interlayer insulating film 15a is formed over the whole surface of the substrate. Then, a via hole to be connected to the via hole 18c is formed on the interlayer insulating film 15a, and a trench 18d is formed in the interlayer insulating film 15a to be connected to the contact plug 10. Thereafter, a metal nitride film 13 such as titanium nitride is deposited over the whole surface of the substrate and is subjected to the CMP treatment by using the interlayer insulating film 15a as a stopper. Thus, the metal nitride film 13 in portions other than the via hole 18c and the trench 18d is removed (FIG. 19).

Figure 20:
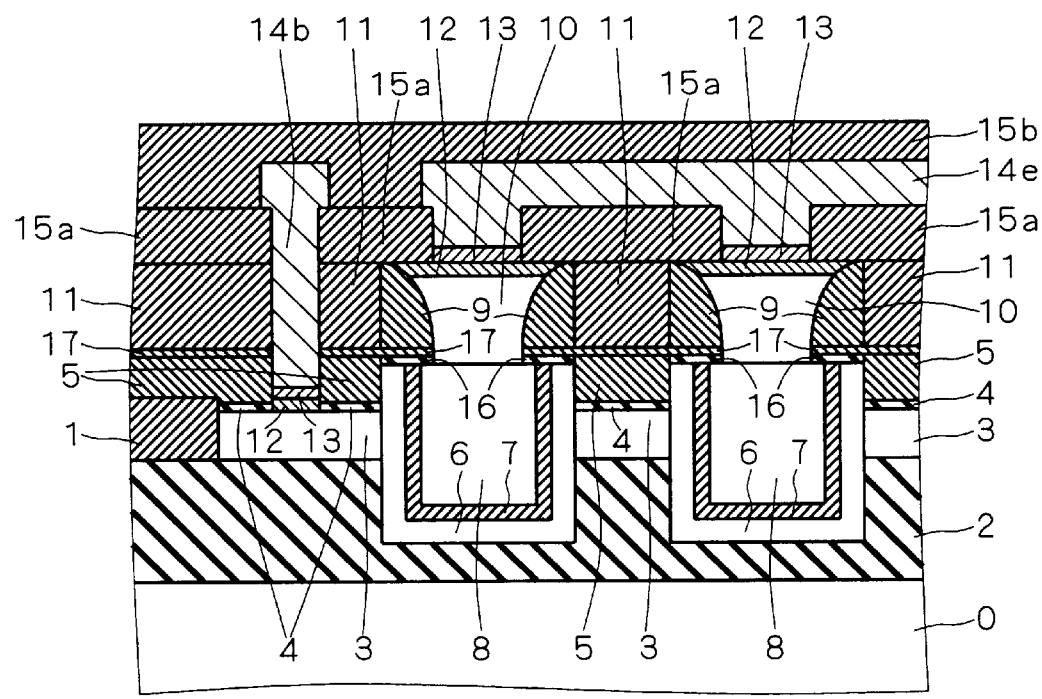

Subsequently, a metal film made of tungsten or the like is formed over the whole surface of the substrate, and the metal wirings 14b and 14e are subjected to patterning by using the photolithography and etching techniques. Then, an interlayer insulating film 15b is formed. Thus, the same trench type capacitor as the trench type capacitor shown in FIG. 1 can be formed (FIG. 20).

Advantages obtained by the existence of the side wall 9 and the insulating film 16 will be described below with reference to FIGS. 21 to 24. First of all, it is assumed that the side wall is not provided but the contact plug 10 is formed to fill up the trench 18b. In this case, the first electrode 6 and the second electrode 8 are short-circuited in a portion shown by X and do not function as capacitors as shown in FIG. 21.

Figure 21:
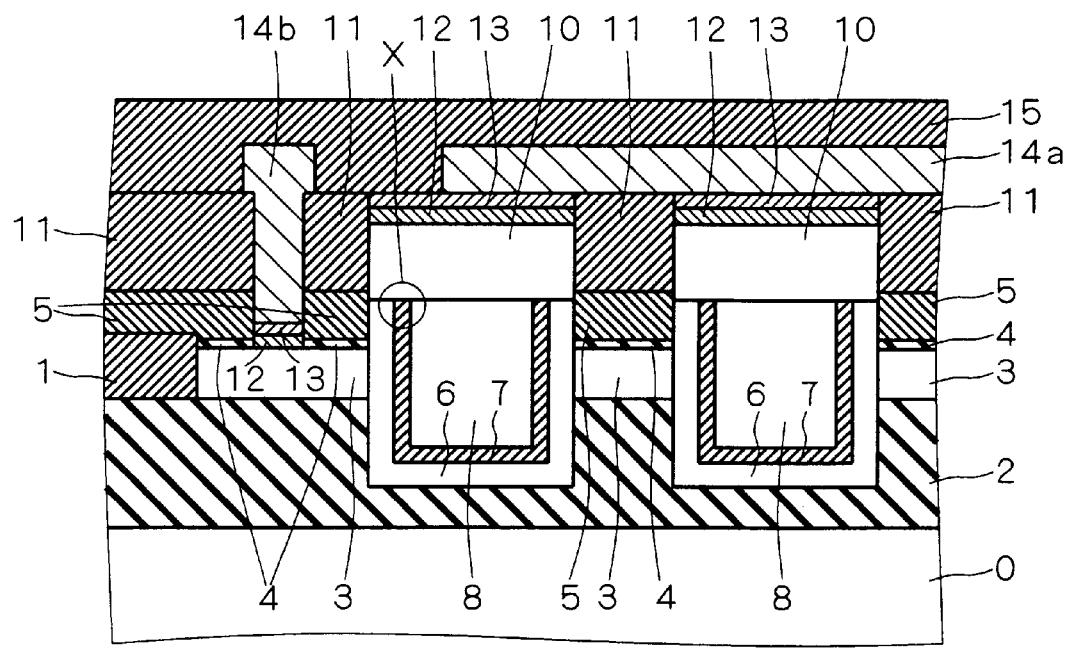
FIGS. 21 and 22 are sectional views illustrating the advantage of a side wall 9 of the semiconductor device according to the first embodiment.
Figure 22:
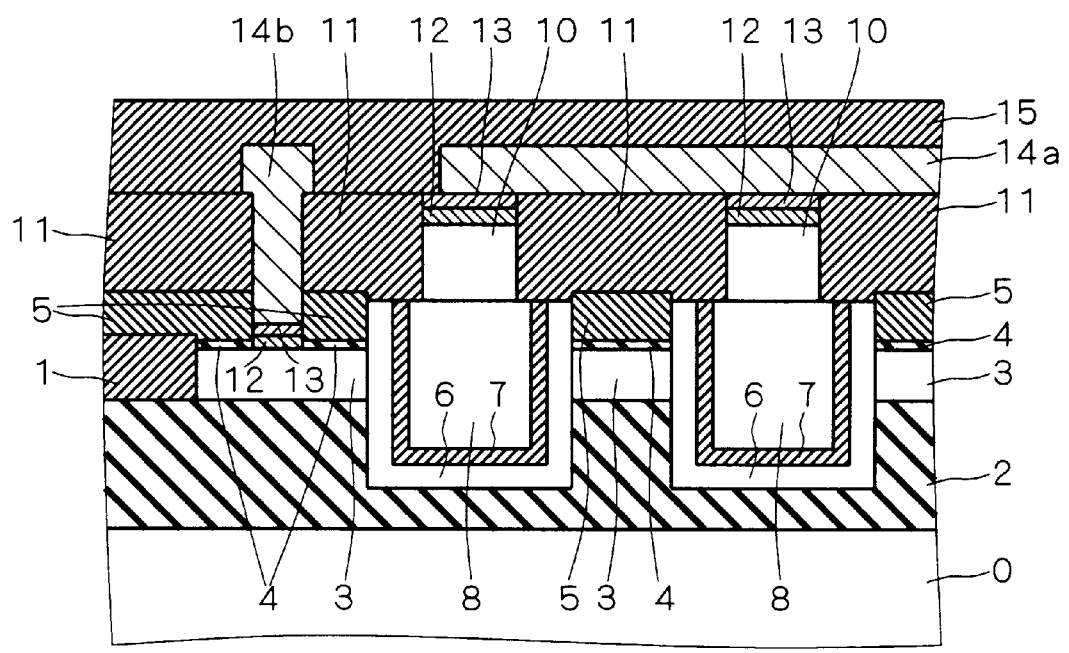

As a method for solving the problem of FIG. 21, it is proposed that a diameter of the contact plug 10 is reduced as shown in FIG. 22. With this structure, the first electrode 6 and the second electrode 8 are not short-circuited. However, since the diameter of the contact plug 10 is small, a contact resistance is easily increased. When a trench is to be provided to form the contact plug 10, the first electrode 6 and the second electrode 8 might be short-circuited if the alignment precision of a photomask of the photolithography technique is low and the trench cannot be formed such that it is not connected to the first electrode 6 but is connected to the second electrode 8.

Figure 23:
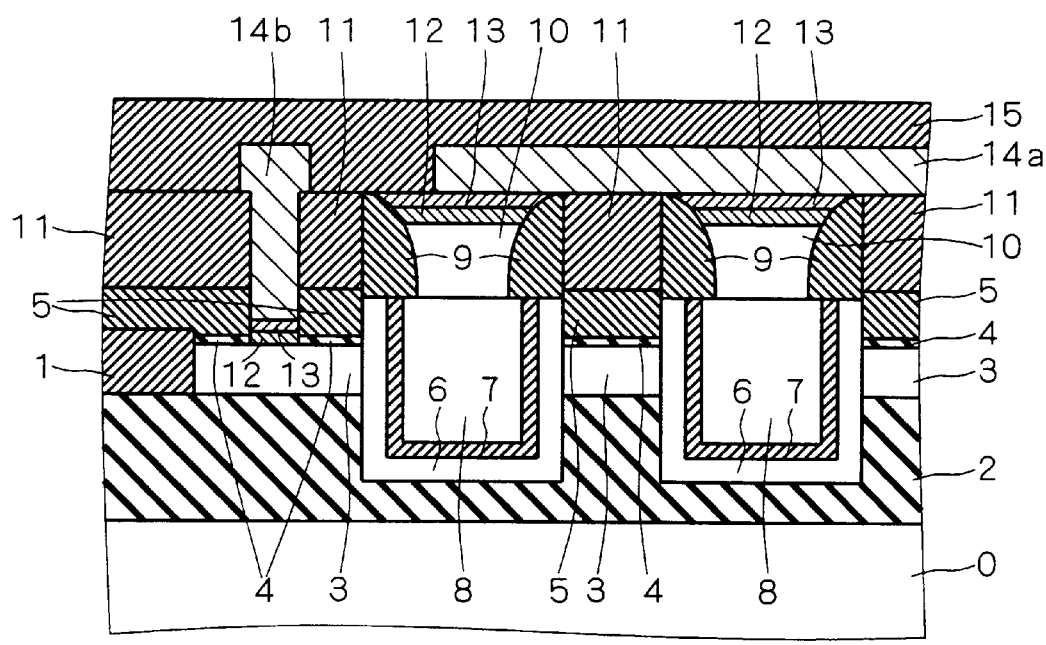
FIG. 23 is a sectional view illustrating the advantage of an insulating film 16 of the semiconductor device according to the first embodiment.

Therefore, it is desirable that the side wall 9 should be formed as shown in FIG. 23. Since a contact face with the metal wiring 14a is great over an upper face of the contact plug 10, the contact resistance can be reduced. Furthermore, the side wall 9 can be formed in a manner of self-alignment to cover the ends of the first electrode 6, the dielectric film 7 and the second electrode 8 in the trench 18b. Therefore, the first electrode 6 and the second electrode 8 are not short-circuited. More specifically, the side wall 9 assures that the contact plug 10 is not connected to the first electrode 6 but is connected to the second electrode 8.

Moreover, a width of a bottom face of the side wall 9 can be set freely to some extent by adjusting a thickness of a film obtained during deposition and etching conditions. Accordingly, also in the case where the alignment precision of the photomask of the photolithography technique is low and the trench 18b cannot be formed just above the trench 18a, the short circuit between the contact plug 10 and the first electrode 6 can be prevented by regulating the width of the bottom face of the side wall 9.

If a material of the side wall 9 is a silicon nitride film and a polysilicon is employed for the first electrode 6 and the second electrode 8, for example, there is a possibility that an interface state might be generated between the side wall 9 and the first electrode 6 and second electrode 8 due to the mismatching of the crystal lattice in the same manner as in the case where the insulating film 5 is directly formed on the SOI layer 3.

Accordingly, it is desirable that the insulating film 16 made of a silicon oxide film having a low degree of the mismatching of the crystal lattice with the polysilicon should be formed between the side wall 9 and the first electrode 6 and second electrode 8. Thus, it is possible to prevent the interface state from generating between the side wall 9 and the end of the capacitor even if a material having a high degree of the mismatching of the crystal lattice between the side wall 9 and the first electrode 6 and between the side wall 9 and the second electrode 8 is used for the side wall 9.

Figure 24:
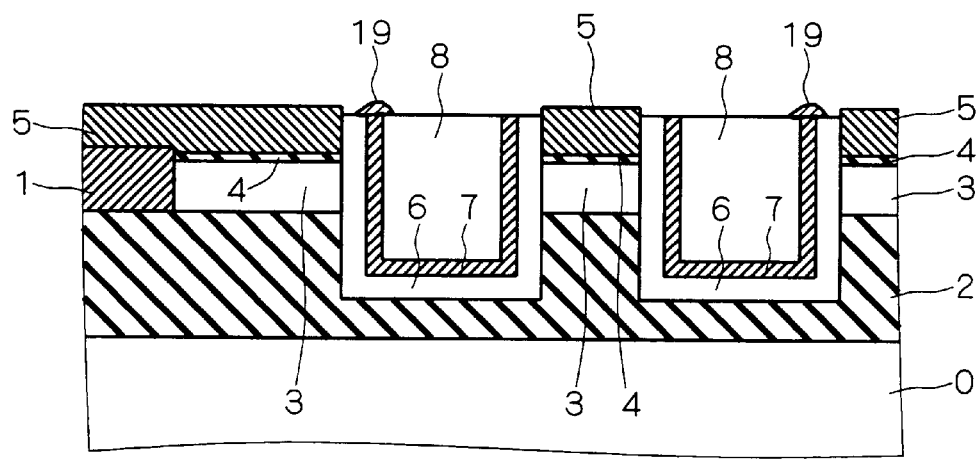
FIG. 24 is a sectional view illustrating the generation of foreign matters in a process of manufacturing the semiconductor device according to the first embodiment.

The formation of the insulating film 16 also has the advantages of a manufacturing method which will be described below. In the stage in which the CMP treatment for the first electrode 6, the dielectric film 7 and the second electrode 8 is completed (FIG. 5), the ends of the first electrode 6 and the second electrode 8 are exposed to the opening of the filled trench 18*a*. Since the first electrode 6 and the second electrode 8 function as both electrodes of the capacitor, they should be electrically isolated from each other. As shown in FIG. 24, however, conductive foreign matters 19 produced during the CMP treatment remain in the opening of the trench 18*a* so that the first electrode 6 and the second electrode 8 are short-circuited in some cases. In order to avoid such a problem, it is desirable that the opening of the trench 18*a* should be washed by using a mixed solution of ammonium hydroxide and hydrogen peroxide liquid, hydrofluoric acid or the like after the stage of FIG. 5, for example.

However, the foreign matters cannot be completely removed by the washing in some cases. For this reason, the insulating film 16 is formed by using the thermal oxidation method. Consequently, even if the foreign matters remain in the opening of the trench 18*a*, they can be insulated by the thermal oxidation. Thus, it is guaranteed that the short circuit between the first electrode 6 and the second electrode 8 can be prevented.

Advantages other than a reduction in the contact resistance which are obtained by forming the metal silicide 12 and the metal nitride film 13 on the contact plug 10 will be described below with reference to FIGS. 25 to 27.

Figure 25:
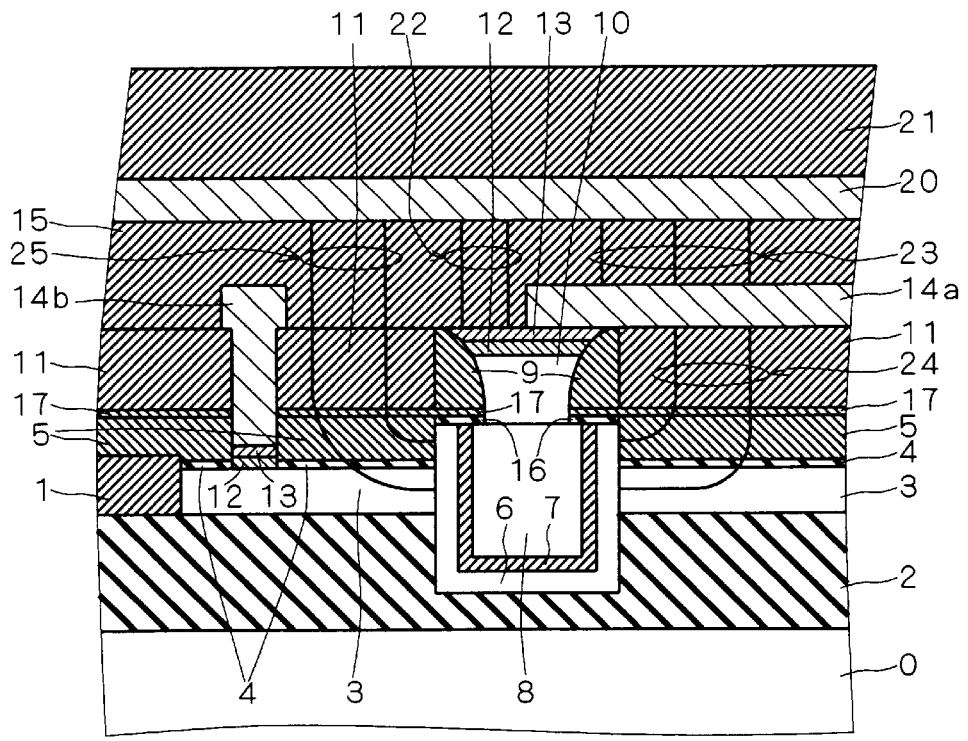
FIGS. 25 and 26 are sectional views illustrating the advantages of a metal silicide 12 and a metal nitride film 13 of the semiconductor device according to the first embodiment.
Figure 26:
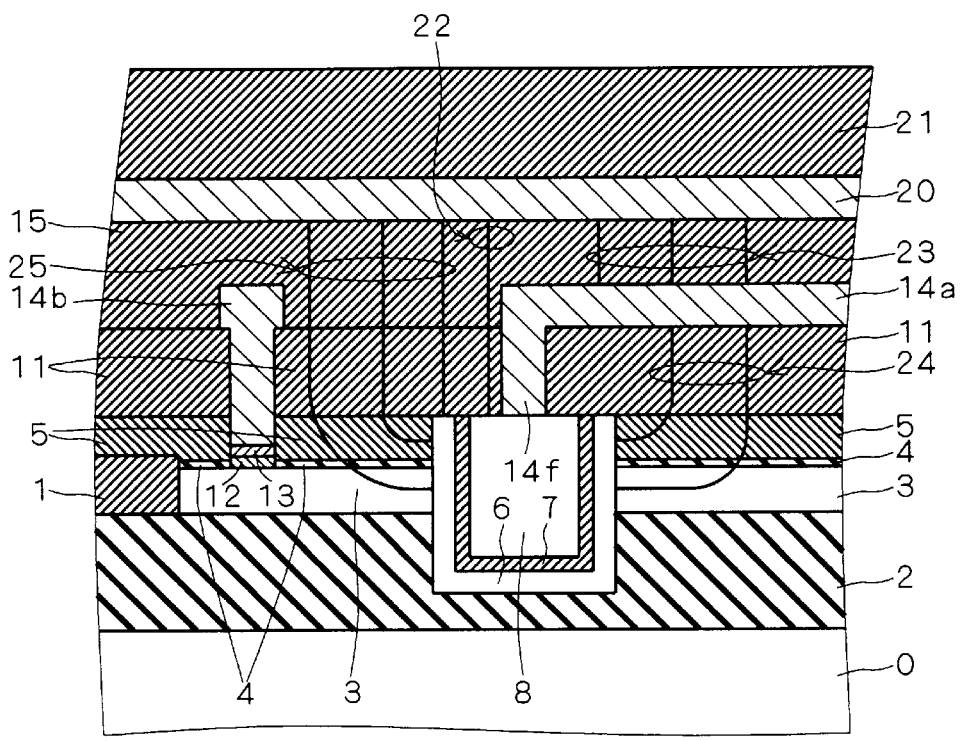

FIG. 25 shows a state in which electric lines of force 22 to 25 are generated in the semiconductor device shown in FIG. 1 when an upper metal wiring 20 and an interlayer insulating film 21 are further formed in the semiconductor device. The electric line of force has such a characteristic that it vertically intersects an equipotential surface and does not enter the inside of a metal wholly having an equipotential. Moreover, a parasitic capacitance is generated between start and end points of the electric line of force.

In FIG. 25, the metal silicide 12 and the metal nitride film 13 are formed above the second electrode 8. Therefore, the electric line of force 22 generated on the upper metal wiring 20 is cut off on the metal silicide 12 and the metal nitride film 13 and does not reach the second electrode 8. Accordingly, the electric potential of the second electrode 8 less fluctuates and smaller noises are made on the second electrode 8. Assuming that the metal wiring 14*a* is directly connected to the second electrode 8 as shown in FIG. 26, the electric line of force 22 reaches the second electrode 8. Therefore, the electric potential of the second electrode 8 easily fluctuates by the influence of the upper metal wiring 20. Accordingly, it is desirable that the metal silicide 12 and the metal nitride film 13 should be formed on the contact plug 10.

Figure 27:
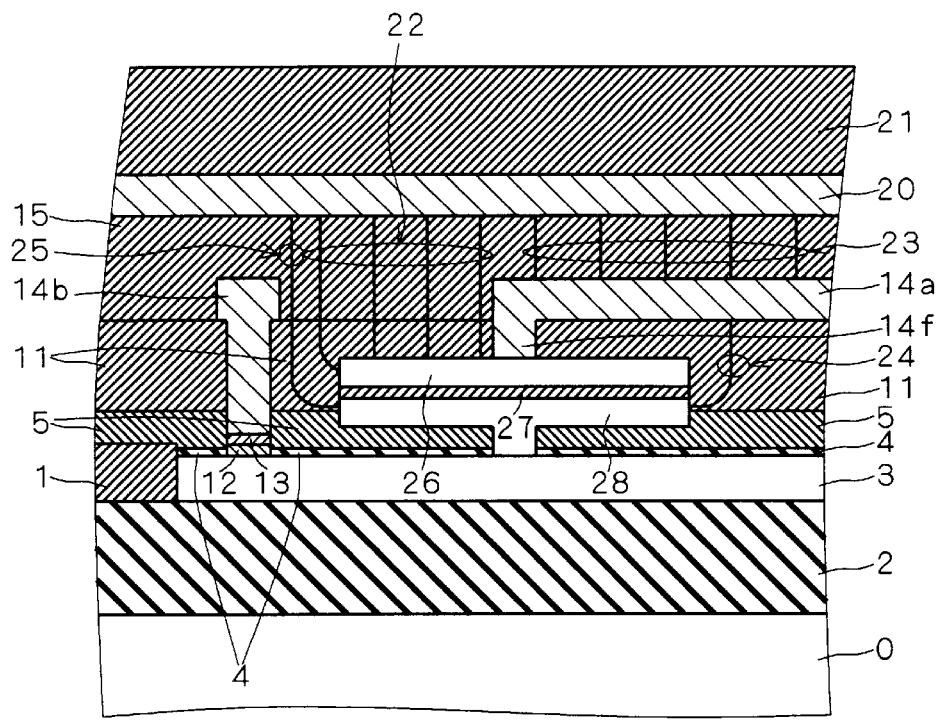
FIG. 27 is a sectional view illustrating a line of electric force in a lateral capacitor.

In a lateral capacitor comprising an upper electrode 26, a dielectric film 27 and a lower electrode 28 shown in FIG. 27, the metal wiring 20 and the upper electrode 26 or the lower electrode 28 overlap with a large area. Therefore, the electric line of force 22 has a high density. Accordingly, it is apparent that the electric potential of the second electrode 8 in the semiconductor device having the structure shown in FIG. 26 less fluctuates than in the lateral capacitor.

Second Embodiment

The present embodiment will describe the case where the semiconductor device according to the first embodiment is applied to a memory cell of a DRAM.

Figure 28:
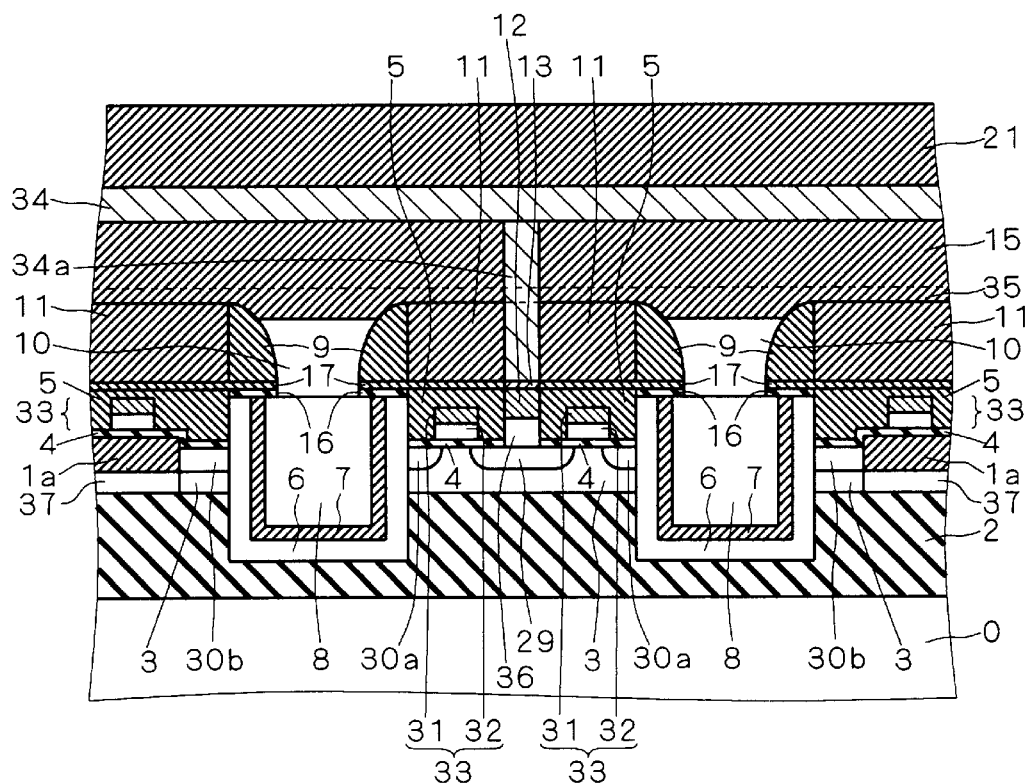
FIG. 28 is a sectional view showing a semiconductor device according to a second embodiment.

FIG. 28 shows a semiconductor device according to the present embodiment. The semiconductor device comprises a trench type capacitor which is formed in a trench having a bottom face in a BOX layer 2 without penetrating the BOX layer 2 in the same manner as in the semiconductor device according to the first embodiment. Since the same reference numerals as those in FIG. 1 denote portions having the same functions as in the semiconductor device according to the first embodiment, their description will be omitted.

Active regions 29, 30*a* and 30*b* are selectively formed in a part of an SOI layer 3. Moreover, a gate electrode 33 comprising a polysilicon 32 and a metal silicide 31 is formed on an insulating film 4 provided between the active regions 29 and 30*a*. The active regions 29, 30*a* and 30*b* function as a source/drain region of a MOSFET, the insulating film 4 functions as a gate insulating film of the MOSFET, and the gate electrode 33 functions as a gate of the MOSFET.

A bit line 34 is connected to the active region 29 through a polysilicon 36, a metal silicide 12 and a metal nitride film 13.

A STI region 1*a* having a partial trench structure is employed as an element isolating region. In a lower portion of the STI region 1*a* is provided a channel cut layer 37 in which an impurity having a reverse type to the type of each of the active regions 29, 30*a* and 30*b* is implanted. Consequently, electric charges can be prevented from moving in the active region 30*b* and the SOI layer 3. Moreover, the gate electrode 33 functioning as a wiring is formed above the STI region 1*a*.

In FIG. 28, wirings to be connected to the metal silicide 12 and the metal nitride film 13 which are formed on a surface of the contact plug 10, and the contact plug 10 are collectively indicated as a cell plate 35. The cell plate 35 is shown in a broken line to be present on a section other than the section shown in FIG. 28.

By using the semiconductor device according to the present embodiment, the active region 30*a* connected to the trench type capacitor constitutes a part of the MOSFET as the source/drain region. Therefore, the trench type capacitor and the MOSFET can be used as memory cells of the DRAM, for example.

If the active region 30*a* does not constitute a part of the MOSFET but is connected to a transistor formed in any portion on a substrate, the same function can be obtained.

Figure 41:
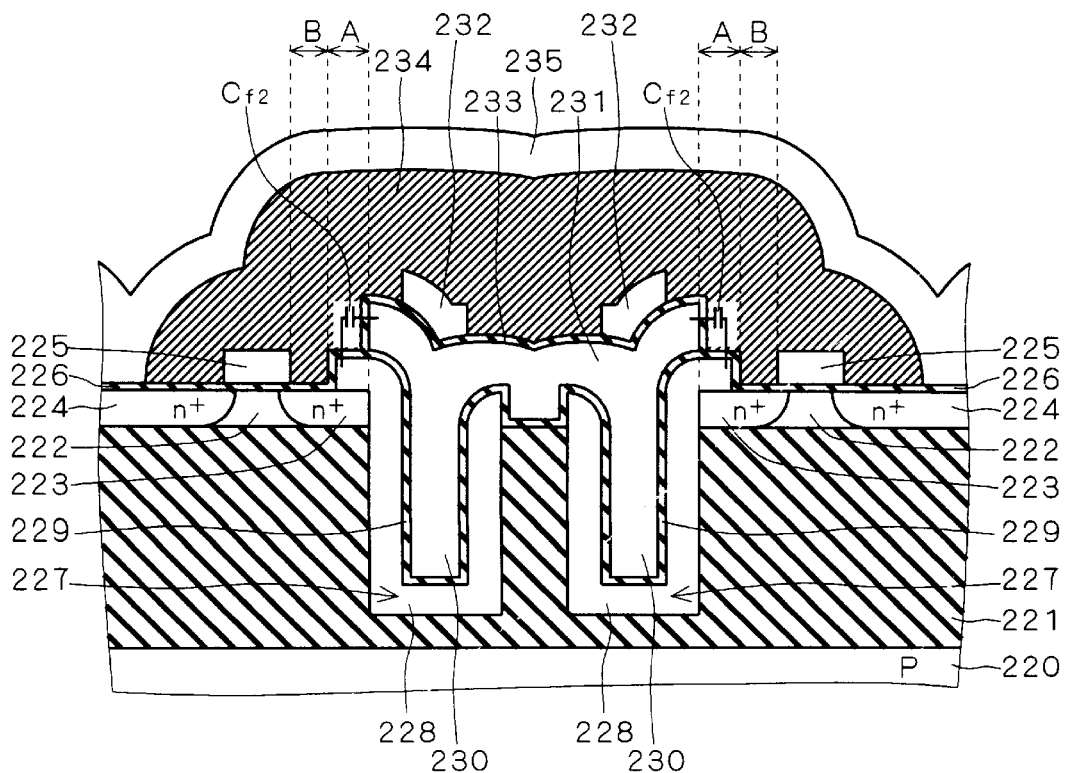

By a comparison between the trench type capacitor shown in FIG. 41 and the trench type capacitor shown in FIG. 28, the following differences are made in addition to area penalty, a contact resistance between an electrode and a metal wiring, and the like.

In the trench type capacitor shown in FIG. 41, first of all, a transfer gate 232 is formed on the capacitor through an insulating film 233. Therefore, a capacity of the capacitor increases a parasitic capacitance of the transfer gate 232. As a result, if the transfer gate 232 is used as a word line, the number of memory cells which can be added to one word line is limited. Correspondingly, the number of sense amplifiers is increased so that the area penalty is easily increased.

Moreover, the transfer gate 232 is formed on the capacitor. Therefore, in the case where the transfer gate 232 is to be formed by using photolithography and etching techniques simultaneously with the formation of a gate electrode 225 of a MOSFET, there is a possibility that the transfer gate 232 and/or the gate electrode 225 might not have a patterning dimension as designed due to the generation of a difference in height.

In the trench type capacitor shown in FIG. 41, moreover, a dielectric film 229 of the capacitor and a gate insulating film 226 of the MOSFET are formed of the same material. For this reason, there is no degree of freedom that a silicon oxide film is employed for the gate insulating film and a high dielectric film is employed for the dielectric film.

On the other hand, the semiconductor device according to the present embodiment does not cause the above-mentioned problems.

A method for manufacturing the trench type capacitor shown in FIG. 28 will be described below with reference to FIGS. 29 to 37. First of all, a semiconductor substrate 0 having a BOX layer 2 and an SOI layer 3 formed thereon is prepared. Then, a channel cut layer 37 is formed by implantation of an impurity. An SiOF film or the like is buried in an upper portion of the channel cut layer 37 by using photolithography and etching techniques. Thus, an STI region 1a is formed. Then, a gate insulating film 4 is formed over a whole surface of the substrate, and a polysilicon 32 and a metal are formed over the whole surface of the substrate. Thereafter, a metal silicide 31 is formed by a heat treatment, and the polysilicon 32 and the metal silicide 31 are patterned as a gate electrode 33.

Figure 29:
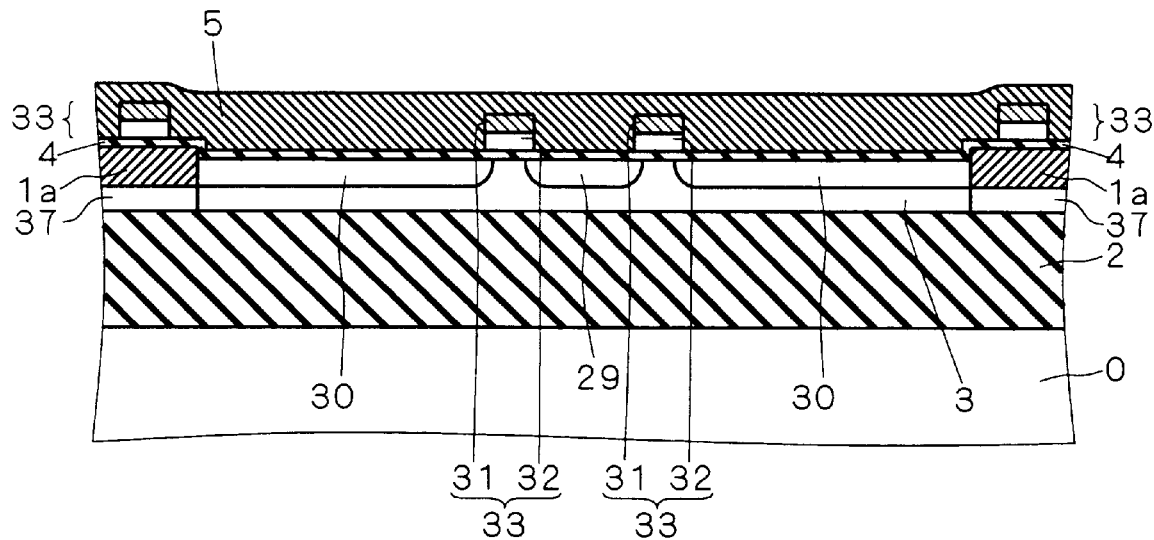
FIGS. 29 to 37 are sectional views showing each step of a method for manufacturing the semiconductor device according to the second embodiment.

Then, an impurity is implanted to form active regions 29 and 30, and an insulating film 5 is formed over the whole surface of the substrate by using a CVD method, for example (FIG. 29).

Figure 30:
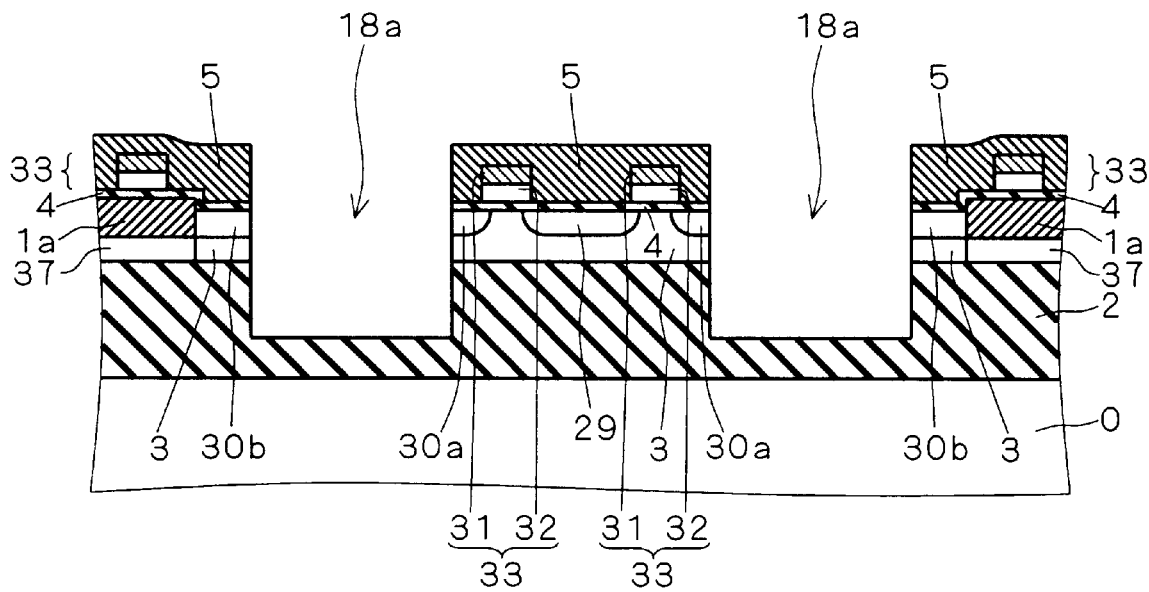
Figure 31:
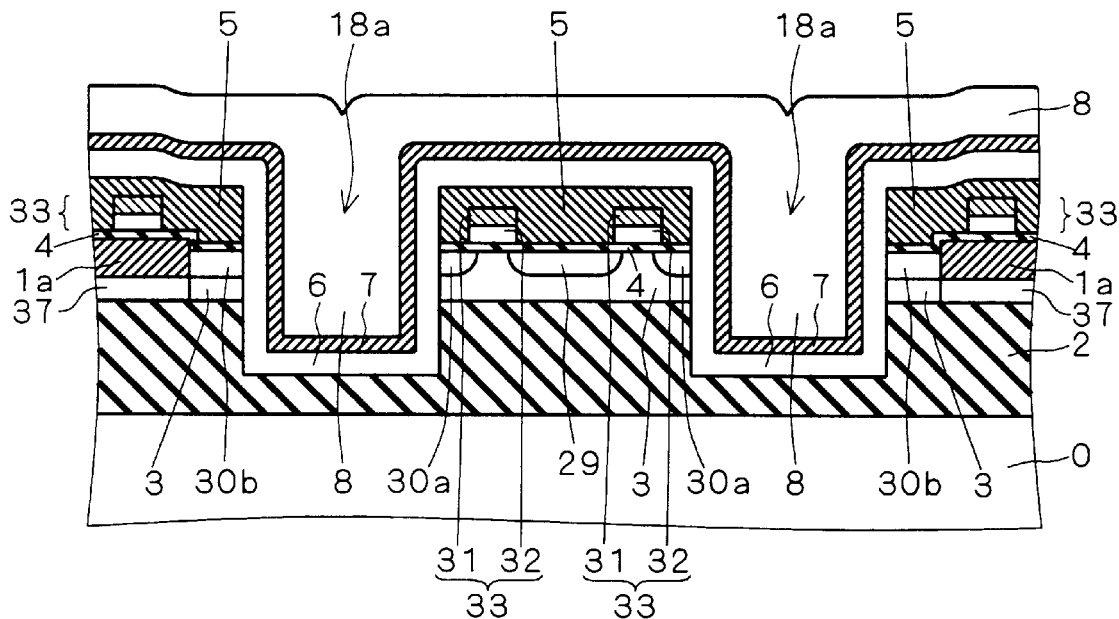

Subsequently, a trench 18a having a bottom face in the BOX layer 2 is formed through the insulating film 5, the insulating film 4, the active region 30 and the SOI layer 3 by using the photolithography and etching techniques (FIG. 30). Consequently, the active region 30 is divided into regions 30a and 30b. Then, materials of a first electrode 6, a dielectric film 7 and a second electrode 8 are formed over the whole surface of the substrate in this order, respectively (FIG. 31). At this time, a surface-roughing treatment may be carried out for a surface of the first electrode 6 on the dielectric film 7 side. The surface-roughing treatment designates a treatment for forming concave and convex portions on the surface of the first electrode 6 to increase a contact area of the first electrode 6 and the dielectric film 7. More specifically, if the first electrode 6 is a polysilicon, for example, it is preferable that a minute nucleus of silicon should be formed on the first electrode 6 by irradiating a silane gas over a surface of an electrode by a CVD device after the formation of the first electrode 6 and a pressure should be then reduced to perform a heat treatment for a while.

Figure 32:
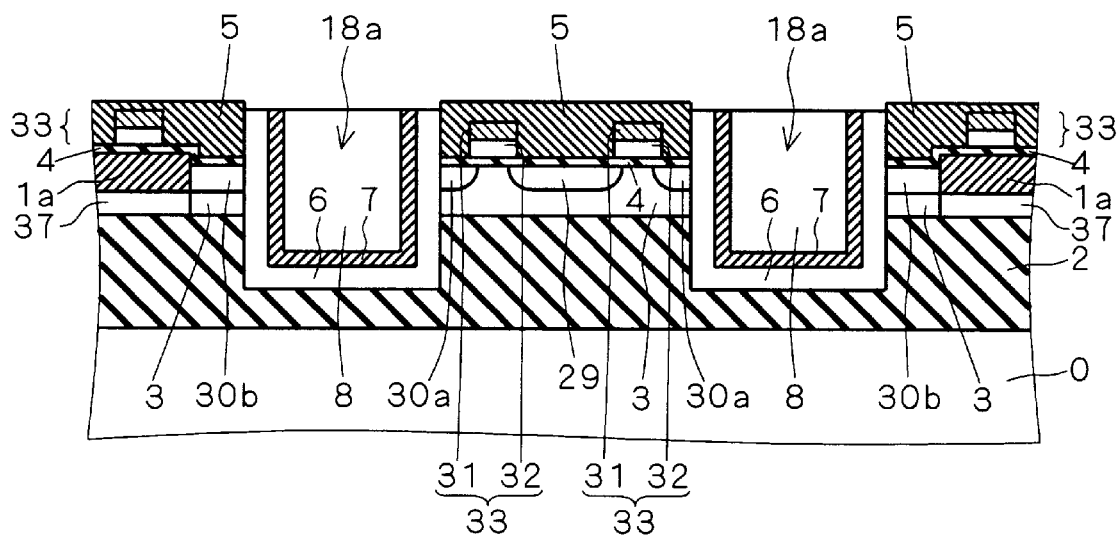

Subsequently, a CMP treatment is carried out by using the insulating film 5 as a stopper, thereby removing portions of the materials of the first electrode 6, the dielectric film 7 and the second electrode 8 which are provided on a surface of the insulating film 5 (FIG. 32).

Figure 33:
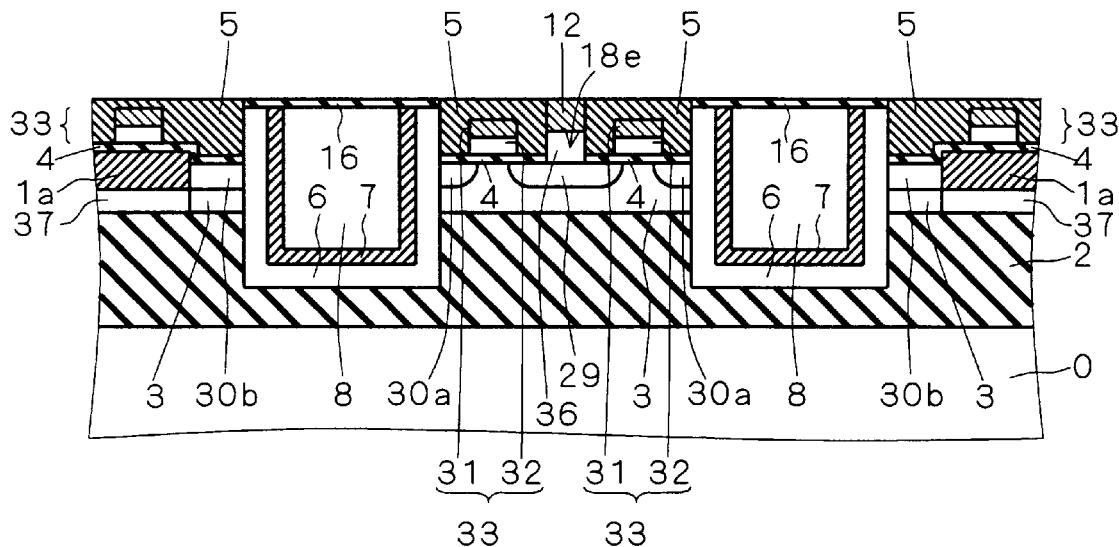

Then, an insulating film 16 made of a silicon oxide film is formed, by a thermal oxidation method, on the surfaces of the first electrode 6, the dielectric film 7 and the second electrode 8 which are exposed to an opening of the trench 18a. Thereafter, a via hole 18e to be connected to the active region 29 is formed by using the photolithography and etching techniques and a polysilicon is formed over the whole surface of the substrate. Subsequently, a portion of the polysilicon provided on the insulating film 5 is removed by the CMP treatment, thereby burying a polysilicon 36 in the via hole 18e, for example. Thus, a surface of the polysilicon 36 is changed into a metal silicide 12 (FIG. 33).

Figure 34:
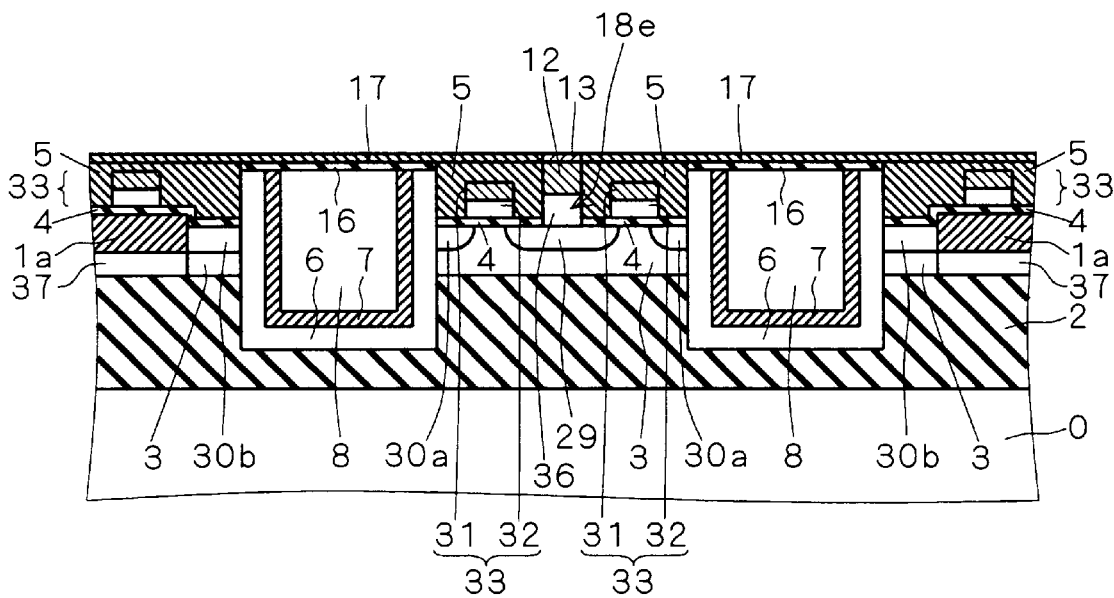
Figure 35:
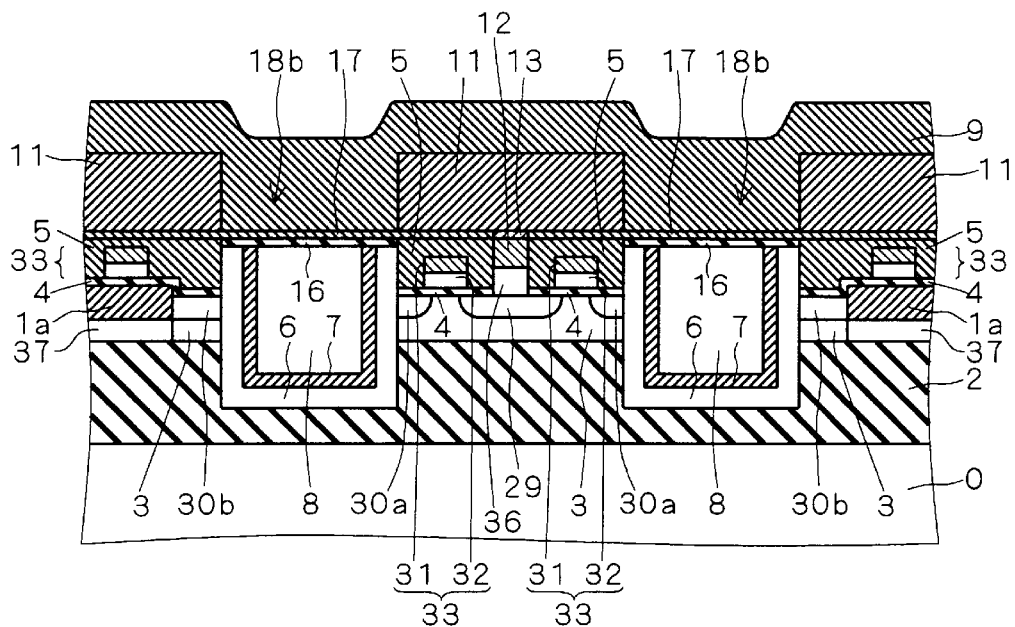

Subsequently, an insulating film 17 is formed over the whole surface of the substrate. A portion of the insulating film 17 which is provided above the via hole 18e is opened by using the photolithography and etching techniques. A metal nitride film 13 is formed in the opening portion (FIG. 34). Furthermore, an interlayer insulating film 11 is formed on an upper face of the insulating film 17. By using the photolithography and etching techniques, a trench 18b is then formed on the interlayer insulating film 11 provided above the trench 18a. Thereafter, a material of a side wall 9 is formed over the whole surface of the substrate (FIG. 35) and is subjected to anisotropic etching to form the side wall 9 and to etch the insulating films 16 and 17. Thus, a contact of the second electrode 8 can be obtained. At this time, the side wall 9 is formed thickly across the first electrode 6, the dielectric film 7 and the second electrode 8.

Then, a material of a contact plug 10 is formed over the whole surface of the substrate. A portion of the material of the contact plug 10 which is provided on a surface of the interlayer insulating film 11 is removed by using the CMP method, for example. At this time, the interlayer insulating film 11 and the side wall 9 are used as stoppers for the CMP treatment. The material of the contact plug 10 which is provided on the surface of the interlayer insulating film 11 may be removed by the anisotropic etching.

Figure 36:
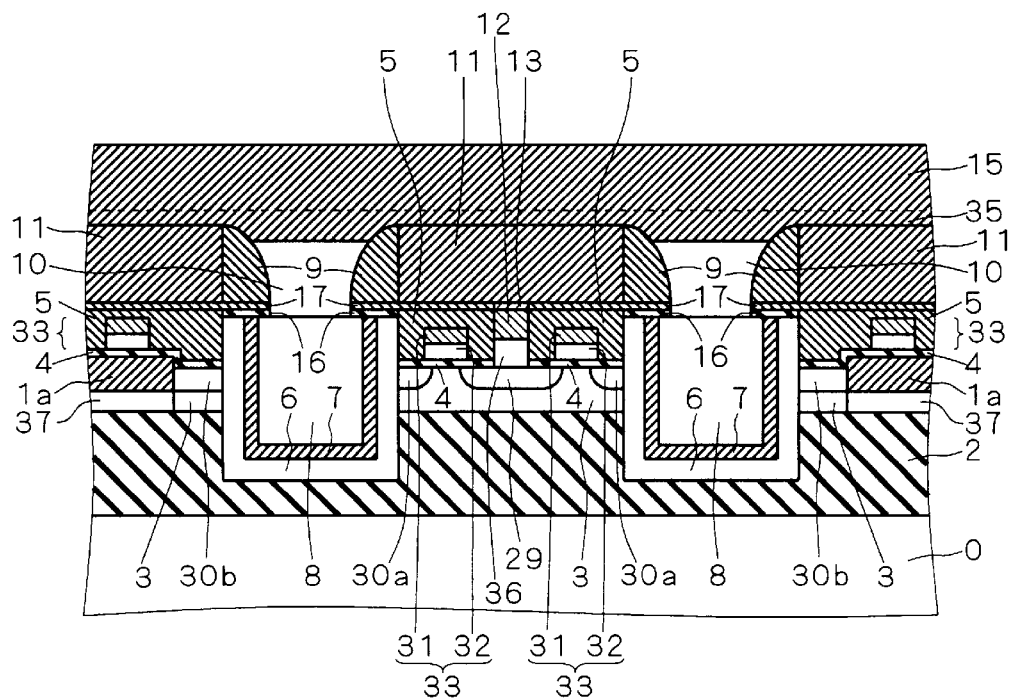

Subsequently, a cell plate 35 connected to the contact plug 10 is formed. Then, an interlayer insulating film 15 is formed (FIG. 36).

Figure 37:
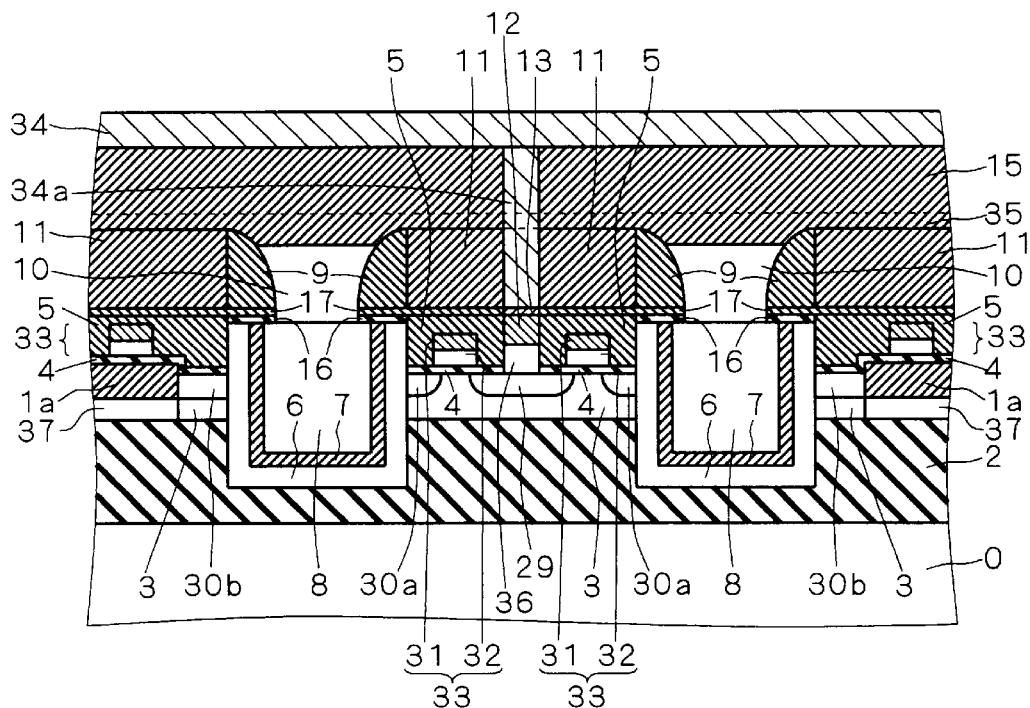

Thereafter, a via hole is formed on the interlayer insulating films 15 and 11 by using the photolithography and etching techniques such that a contact with the metal nitride film 13 on the via hole 18e can be obtained. A bit line 34 and a contact plug 34a thereof are formed in the via hole (FIG. 37).

Furthermore, an interlayer insulating film 21 is formed on the bit line 34. Thus, the semiconductor device shown in FIG. 28 is completed.

Figure 38:
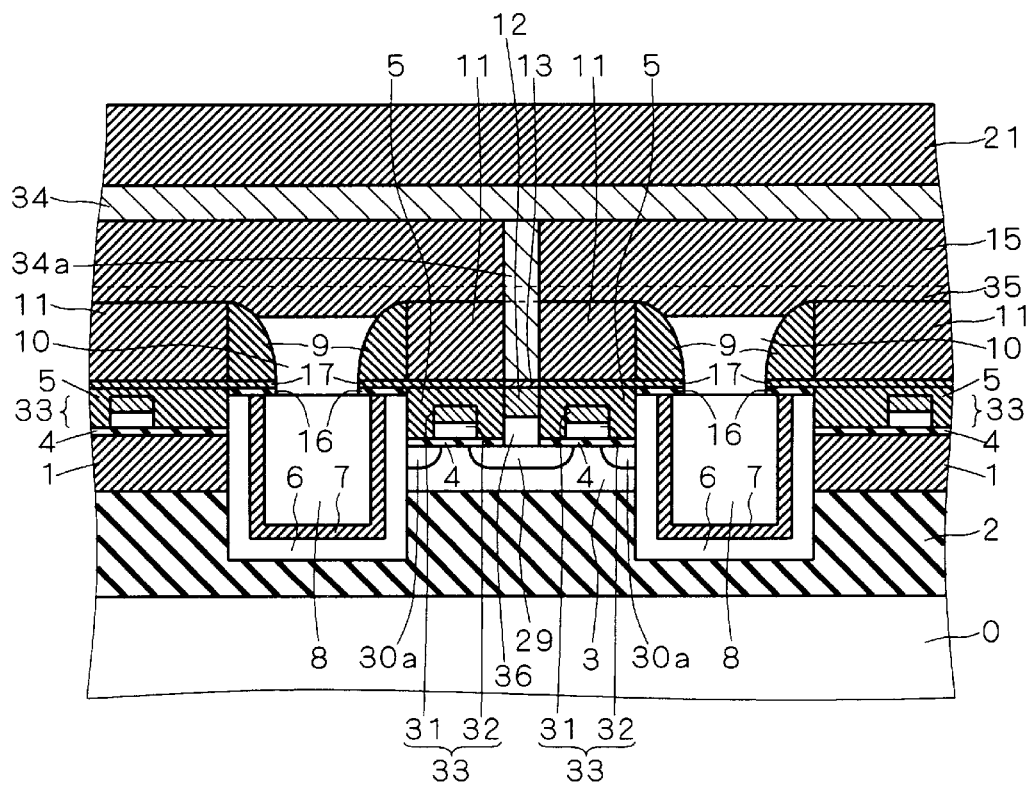
FIG. 38 is a sectional view showing a variant of the semiconductor device according to the second embodiment.
Figure 39:
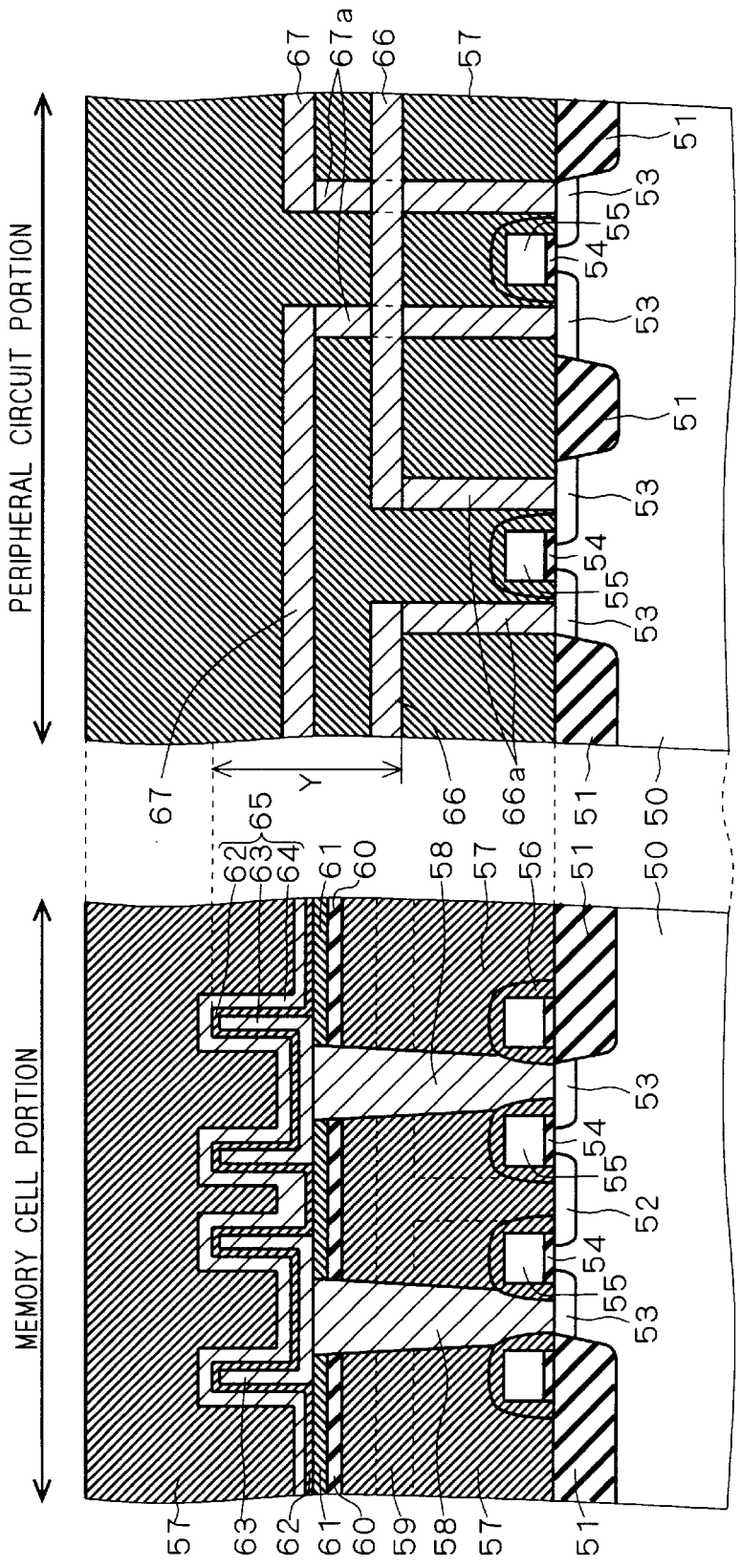
FIG. 39 is a sectional view showing a DRAM which employs a stack type capacitor for a memory cell.
Figure 40:
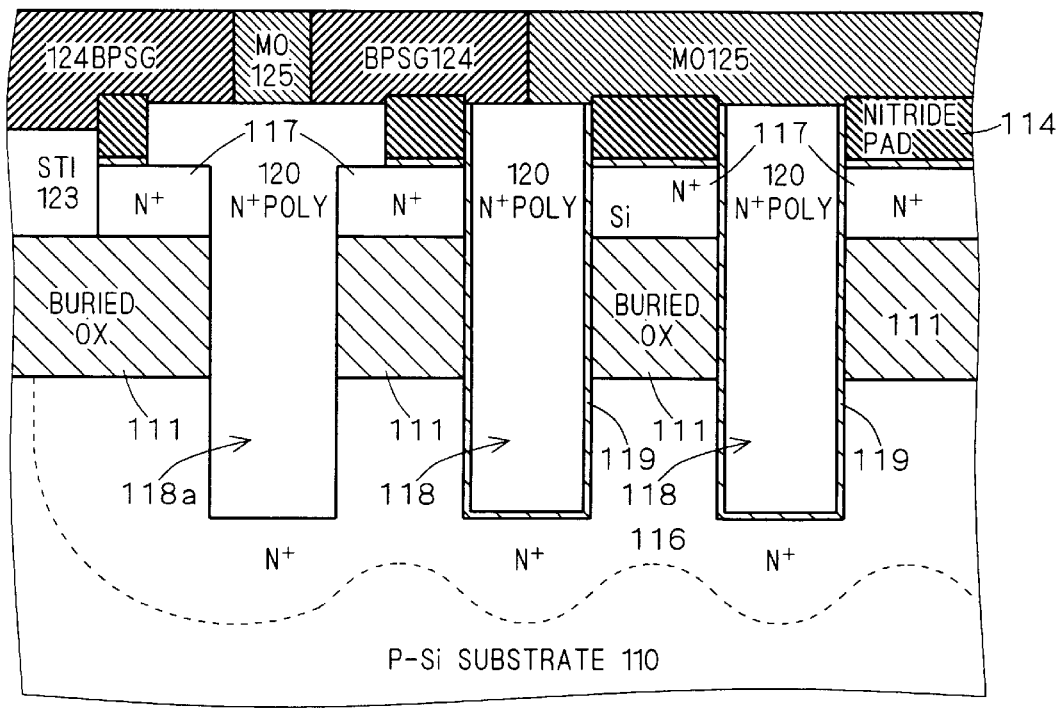
FIGS. 40 and 41 are sectional views showing a trench type capacitor according to the prior art.

While the STI region 1a of a partial trench type has been employed in the semiconductor device shown in FIG. 28, an STI region 1 having a complete separating structure may be employed as shown in FIG. 38. In the case where a leakage current cannot fully be suppressed by the channel cut layer 37, it can be prevented more reliably by employing the STI region 1 having the complete separating structure. If the leakage current can be suppressed, it is possible to obtain an advantage that a refresh period of the DRAM can be prolonged.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a semiconductor substrate;
   a first layer of insulation formed on said semiconductor substrate;
   a second layer including at least a semiconductor layer formed on said first layer;

a trench provided with an opening having a predetermined width on a surface of said second layer and reaching said first layer without penetrating said first layer; and a capacitor including a first electrode, a dielectric film and a second electrode which are formed in said trench, wherein an end of said capacitor is positioned in said opening of said trench.

2. The semiconductor device according to claim 1, further comprising a contact plug connected to said second electrode and set within a range of said predetermined width.

3. The semiconductor device according to claim 2, further comprising a wiring to be connected to said contact plug, a metal silicide being formed in a portion of said contact plug which is connected to said wiring.

4. The semiconductor device according to claim 3, wherein a metal nitride film is formed between said metal silicide and said wiring.

5. The semiconductor device according to claim 2, further comprising an insulator for covering said end of said capacitor.

6. The semiconductor device according to claim 5, wherein said insulator includes a first insulating layer which is provided in contact with said end of said capacitor and has a relatively low degree of mismatching of crystal lattice between said first insulating layer and said first electrode and between said first insulating layer and said second electrode; and a second insulating layer which is formed on said first insulating layer and has a relatively high degree of said mismatching of said crystal lattice between said second insulating layer and said first electrode and between said second insulating layer and said second electrode.

7. The semiconductor device according to claim 1, further comprising an active region connected to said first electrode in said second layer, said active region constituting a part of a transistor or being connected to said transistor.

* * * * *